United States Patent [19]
Sato

[11] Patent Number: 5,840,613
[45] Date of Patent: Nov. 24, 1998

[54] FABRICATION METHOD FOR SEMICONDUCTOR DEVICE

[75] Inventor: Fumihiko Sato, Tokyo, Japan

[73] Assignee: NEC Corporation, Japan

[21] Appl. No.: 873,357

[22] Filed: Jun. 12, 1997

Related U.S. Application Data

[62] Division of Ser. No. 730,083, Oct. 15, 1996, Pat. No. 5,798,561.

[30] Foreign Application Priority Data

Oct. 16, 1995 [JP] Japan .................................. 7-267173

[51] Int. Cl.⁶ .................................................. H01L 21/331
[52] U.S. Cl. .......................... 438/320; 438/366; 438/489; 438/657; 438/969
[58] Field of Search ..................................... 438/312, 320, 438/366, 365, 657, 488, 489, 969, 933, 689, 165, 249, 291; 257/197, 198

[56] References Cited

U.S. PATENT DOCUMENTS 5,494,836 2/1996 Imai ........................................... 437/31
5,504,018 4/1996 Sato ........................................... 437/31

*Primary Examiner*—Peter Toby Brown
*Assistant Examiner*—Long Pham
*Attorney, Agent, or Firm*—Hayes, Soloway, Hennessey, Grossman & Hage, P.C.

[57] ABSTRACT

A semiconductor device including a bipolar transistor is provided, which can reduce the base resistance of the transistor. This device includes a semiconductor base region having a first semiconductor active region of a first conductivity type in its inside. A first insulating layer is formed on the main surface of the substructure to cover the first active region. The first insulating layer has a first penetrating window exposing the first active region. A semiconductor contact region of a second conductivity type is formed on the first insulating layer. The contact region has an overhanging part which overhangs the first window. The second window is defined by the inner end of the overhanging part to be entirely overlapped with the first window. The contact region is made of a polycrystalline semiconductor. A second semiconductor active region of the second conductivity type is formed on the first active region in the first window. A semiconductor connection region of the second conductivity rope is formed in the first window to surround the second active region. The connection region is contacted with the overhanging part or the contact region and the second active region, thereby electrically interconnecting the second active region with the contact region. The connection region is made of a polycrystalline semiconductor.

8 Claims, 17 Drawing Sheets

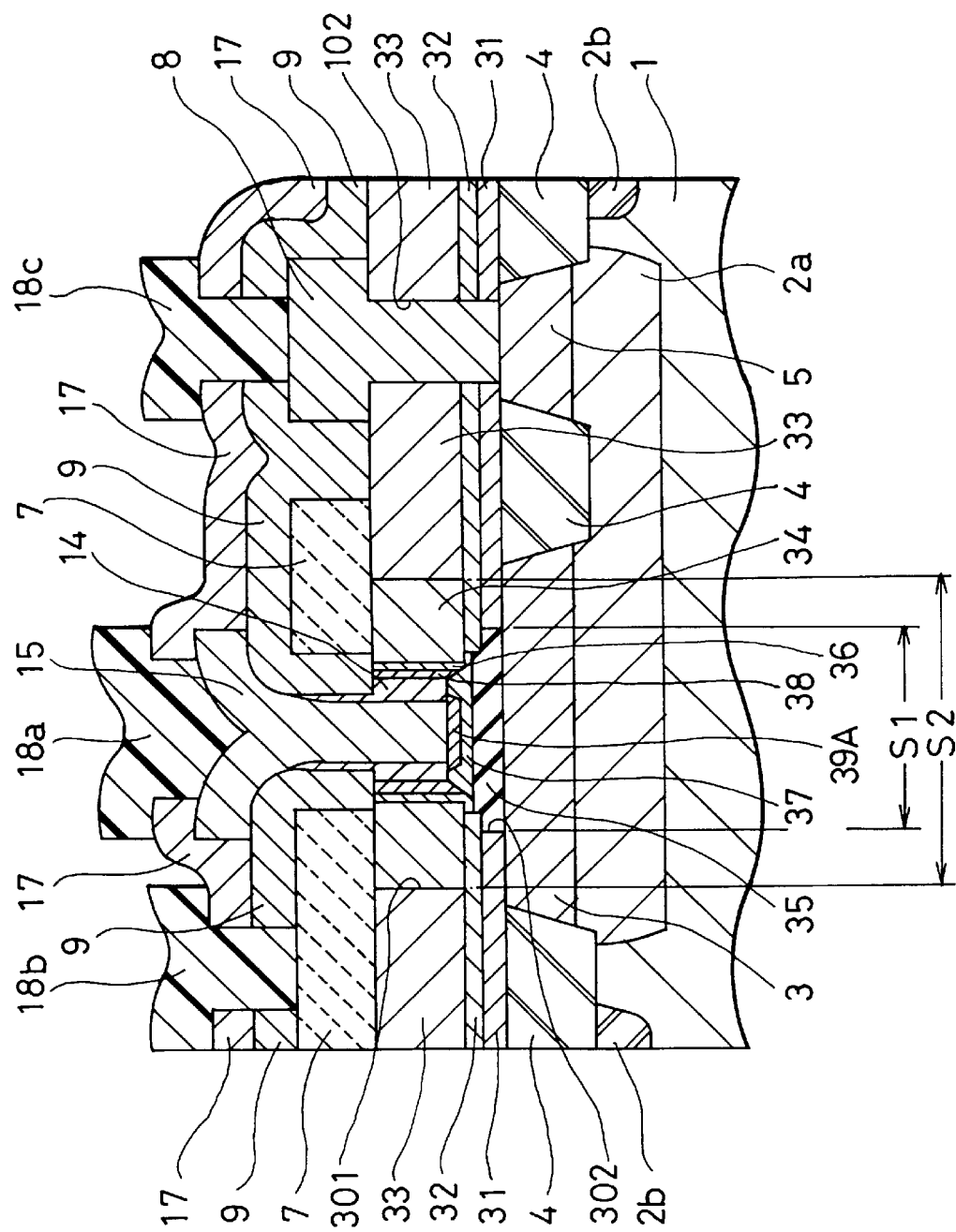

5,840,613

FABRICATION METHOD FOR SEMICONDUCTOR DEVICE

This is a divisional of application Ser. No. 08/730,083 filed on Oct. 15, 1996 now U.S. Pat. No. 5,798,561.

BACKGROUND OF THE INVENTION

1. Field of the Invention

The present invention relates to a semiconductor device and more particularly, to a semiconductor device including a bipolar transistor whose base resistance is reduced, and a fabrication method of the device.

2. Description of the Prior Art

A conventional semiconductor device of this sort is shown in FIG. 1, which was disclosed in the Japanese Non-Examined Patent Publication No. 4-330730 published in November 1992. Although this device includes a plurality of bipolar transistors, only one of the plurality of bipolar transistors is shown here for the sake of simplification of description.

As shown in FIG. 1, this semiconductor device has a semiconductor base region 1100 at which, an npn bipolar transistor is formed. The base region 1100 includes a p-type single-crystal silicon substrate 1001, and an $n^-$-type single-crystal silicon epitaxial layer formed on the main surface of the substrate 1001.

The epitaxial layer is partitioned by a patterned isolation insulating layer 1004 made of silicon dioxide ($SiO_2$), thereby forming a device-forming region in which the bipolar transistor is formed. The isolation $SiO_2$ layer 1004 is formed by using the well-known Local Oxidation of Silicon (LOCOS) technique.

The epitaxial layer is partitioned by the isolation $SiO_2$ layer 1004 to thereby form an $n^-$-type collector region 1003 and an $n^+$-type collector connection region 1005. An $n^+$-type buried region 1002 is formed in the surface area of the substrate 1001 to laterally extend from the collector region 1003 to the collector connection region 1005.

The surface of the base region 1100 is covered with a $SiO_2$ layer 1006 having windows 1101 and 1102. The window 1101 is located over the collector region 1003 to partially expose the region 1003. The window 1102 is located over the collector connection region 1005 to partially expose the region 1005.

A $p^+$-type polysilicon layer 1007 is selectively formed on the $SiO_2$ layer 1006 in the vicinity of the window 1101. The layer 1007 has an overhanging part which laterally overhangs the window 1101, thereby forming a window 1103 to be entirely overlapped with the window 1101. The overhanging part has a ring-like plan shape to extend along the contour of the window 1001.

Within the window 1101 of the $SiO_2$ layer 1006, a p-type single-crystal silicon base region 1019 is formed on the exposed area of the collector region 1003 by a selective epitaxial growth method. A p-type polysilicon layer 1020 is selectively formed on the base region 1019. The top and bottom of the layer 1020 are contacted with the base region 1019 and the polysilicon layer 1007, respectively. The polysilicon layer 1020 has a ring-like plan shape and extends along the ring-like overhanging part of the layer 1007.

A $SiO_2$ sidewall 1014 and an n-type single-crystal silicon emitter region 1016 are formed on the base region 1019. The $SiO_2$ sidewall 1014 has a ring-like plan shape to extend along the ring-like polysilicon layer 1020. The side face of the sidewall 1014 is contacted with the opposing side face of the layer 1020. The emitter region 1016 is surrounded by the sidewall 1014 to insulate the region 1016 from the polysilicon layer 1020.

Within the window 1102 of the $SiO_2$ layer 1006, an $n^+$-type polysilicon layer 1008 is formed to fill the window 1102. The layer 1008 is contacted with the underlying collector connection region 1005. The layer 1008 serves as a collector contact region.

A silicon nitride ($Si_3N_4$) layer 1009 is selectively formed on the polysilicon layer 1007 to cover the layer 1007 and the exposed $SiO_2$ layer 1006. The $Si_3N_4$ layer 1009 covers not only the upper surface of the layer 1007 but also the inner edge of the overhanging part of the layer 1007 The $Si_3N_4$ layer 1009 has base, emitter, and collector windows.

A base electrode 1017a is formed on the $Si_3N_4$ layer 1009 to be contacted with the underlying polysilicon layer 1007 through the base window of the $Si_3N_4$ layer 1009. An emitter electrode 1017b is formed on the $Si_3N_4$ layer 1009 to be contacted with the underlying emitter region 1016 through the emitter window of the $Si_3N_4$ layer 1009. A collector electrode 1017c is formed on the $Si_3N_4$ layer 1009 to be contacted with the underlying polysilicon layer 1008 through the collector window of the $Si_3N_4$ layer 1009. The base, emitter, and collector electrodes 1017a, 1017b and 1017c are made of an aluminum alloy.

The p-type polysilicon layer 1020 and the $p^+$-type polysilicon layer 1007 serve as a base contact region.

With the conventional semiconductor device shown in FIG. 1, the p-type base region 1019 can be formed to have a small thickness by an epitaxial growth process under the control of the $SiO_2$ layer. Also, the n-type emitter region 1016 can be formed in self-alignment with the $SiO_2$ sidewall 1014 and therefore, a part of the base region 1019 serving as the intrinsic base has a small size. Consequently, the npn bipolar transistor is capable of high-speed operation.

The above-described conventional semiconductor device is fabricated by the following process sequence.

First, the structure shown in FIG. 2A is prepared by using known processes. In this state, the $Si_3N_4$ layer 1009 is selectively formed on the polysilicon layer 1007 and the $SiO_2$ layer 1006. The $Si_3N_4$ layer 1009 covers the inner edge of overhanging part of the layer Next, using a selective epitaxial growth process such as the gas-source Molecular Beam Epitaxy (MBE), Ultra-High-Vacuum Chemical Vapor Deposition (UHV-CVD), Low-Pressure CVD (LPCVD) or the like, the p-type single-crystal silicon base region 1019 is grown upward from the exposed surface of the collector region 1003 in the window 1101, as shown in FIG. 2B. During this growth process of the base region 1019, the p-type polysilicon layer 1020 also grows downward from the bottom face of the overhanging part of the p-type polysilicon layer 1007 toward the collector region 1003.

This growth process is continued until the base region 1019 and the polysilicon layer 1020 are contacted with each other, as shown in FIG. 2C.

Thereafter, the base, emitter, and collector electrodes 1017a, 1017b and 1017c are formed by known processes.

Thus, the conventional semiconductor device as shown in FIG. 1 is obtained.

With the conventional semiconductor device of FIG. 1, the p-type single-crystal silicon base region 1019 is formed to cover the entire exposed surface of the collector region 1003 within the window 1101 of the $SiO_2$ layer 1006. The base region 1019 is connected to the $p^+$-type polysilicon layer 1007 serving as a base contact region through the p-type polysilicon layer 1020 serving as a base connection region.

On the other hand, the diffusion coefficient in polysilicon is greater than that in single-crystal silicon. Therefore, even if the doped polysilicon layer 1020 is contacted with the base region 1019, it is difficult to avoid the p-type impurity doped into the layer 1020 from being diffused into the base region 1019 during a subsequent heat-treatment process.

As a result, the outer part of the base region 1019, which is opposite to the polysilicon layer 1020, has approximately the same high electric resistance as that of the inner part of the region 1019, which is opposite to the n-type single-crystal silicon emitter region 1016 and the $SiO_2$ sidewall 1014. This limits high-speed operation of the bipolar transistor.

SUMMARY OF THE INVENTION

Accordingly, an object of the present invention is to provide a semiconductor device in which the base resistance of a bipolar transistor can be reduced, and a fabrication method of the device.

Another object of the present invention is to provide a semiconductor device which makes a bipolar transistor to operate at high speed, and a fabrication method of the device.

The above objects together with others not specifically mentioned will become clear to those skilled in the art from the following description.

According to a first aspect of the present invention, a simiconductor device is provided, which includes a semiconductor base region having a first semiconductor active region of a first conductivity type in its inside. The first active region is exposed from a main surface of said substructure.

A first insulating layer is formed on the main surface of the base region to cover the first active region. The first insulating layer has a first penetrating window or opening which exposes the first active region.

A semiconductor contact region of a second conductivity type is formed on the first insulating layer, The contact region has a second penetrating window or opening whose size is smaller than that of the first window. The contact region has an overhanging part which overhangs the first window. The second window is defined by the inner and of the overhanging part to be entirely overlapped with the first window. The contact region is made of a polycrystalline semiconductor.

A second semiconductor active region of the second conductivity type is formed on the first active region to be contacted therewith in the first window.

A semiconductor connection region of the second conductivity type is formed in the first opening to surround the second active region. The connection region is contacted with the overhanging part of the contact region and the second active region, thereby electrically interconnecting the second active region with the contact region. The connection region is made of a polycrystalline semiconductor.

It is preferred that the connection region is contacted with the first active region, and a contact area of the first and second active regions is narrower than the area of the first window. This enables the high-speed operation of the transistor.

In a preferred embodiment of the first aspect, the semiconductor connection region includes first, second, third, and fourth polycrystalline semiconductor layers. The first, second, third, and fourth polycrystalline semiconductor layers are preferably arranged in a direction perpendicular to the main surface of the substructure.

The first, second, third, and fourth polycrystalline semiconductor layers are preferably made of polysilicon.

In another preferred embodiment of the first aspect, a second insulating layer is additionally formed between the connection region and the first active region. The connection region is contacted with the second insulating layer and is not contacted with the first active region.

Preferably, the semiconductor connection region includes first, second, and third polycrystalline semiconductor layers. The first polycrystalline semiconductor layer is contacted with the second active region, the third polycrystalline semiconductor layer is contacted with the contact region, and the second polycrystalline semiconductor layer is contacted with the first and second polycrystalline semiconductor layers.

The first, second, and third polycrystalline semiconductor layers are preferably arranged in a direction parallel to the main surface of the substructure.

It is preferred that the first and second polycrystalline semiconductor layers are made of SiGe, and the third polycrystalline semiconductor layer is made of polysilicon.

With the semiconductor device according to the first aspect of the present invention, the semiconductor connection region is made of the polycrystalline semiconductor doped with a dopant of the second conductivity type. Therefore, if the doping concentration of the dopant is suitably determined, the electrical resistance of the connection region can be reduced compared with the case where the connection region is made of the same single-crystal semiconductor.

According to a second aspect of the present invention, a fabrication method of a semiconductor device is provided, which includes the following steps.

First, a semiconductor base region having a first semiconductor active region of a first conductivity type in its inside is prepared. The first active region is exposed from a main surface of the base region.

A first insulating region is then formed on the main surface of the base region to cover the first active region. The first insulating region has a first penetrating window or opening which exposes the first active region.

Subsequently, a semiconductor contact region of a second conductivity type is formed on the first insulating region. The contact region has a second penetrating window of opening whose size is smaller than that of the first window. The contact region has an overhanging part which overhangs the first opening. The second opening is defined by the inner end of the overhanging part to be entirely overlapped with the first opening. The contact region is made of a polycrystalline semiconductor.

A second semiconductor active region of the second conductivity type is formed on the first active region to be contacted therewith in the first window.

A semiconductor connection region of the second conductivity type is formed in the first window to surround the second active region. The connection region is contacted with the overhanging part of the contact region and the second active region, thereby electrically interconnecting the second active region with the contact region. The connection region is made of a polycrystalline semiconductor.

In a preferred embodiment according to the second aspect, the semiconductor connection region includes first, second, third, and fourth polycrystalline semiconductor layers. The above step of forming the connection region include the following steps.

The first polycrystalline semiconductor layer is selectively formed to be contacted with the first active region and the fourth polycrystalline semiconductor layer to be contacted with the connection region.

The second polycrystalline semiconductor layer is selectively formed to be contacted with the first polycrystalline semiconductor layer and the second polycrystalline semiconductor layer to be contacted with the second polycrystalline semiconductor layer.

Preferably, the first, second, third, and fourth polycrystalline semiconductor layers are formed to be arranged in a direction perpendicular to the main surface of the substructure.

The first, second, third, and fourth polycrystalline semiconductor layers are preferably made of polysilicon.

In another preferred embodiment according to the second aspect, a step of forming a second insulating layer between the connection region and the first active region is performed. The connection region is contacted with the second insulating layer and is not contacted with the first active region.

In still another preferred embodiment according to the second aspect, the semiconductor connection region includes first, second, and third polycrystalline semiconductor layers. The step of forming the semiconductor connection region includes the following steps.

The first polycrystalline semiconductor layer is formed to be contacted with the second active region.

The third polycrystalline semiconductor layer is formed to be contacted with the contact region.

The second polycrystalline semiconductor layer is formed to be contacted with the first and second polycrystalline semiconductor layers.

The first, second, and third polycrystalline semiconductor layers are preferably formed to be arranged in a direction parallel to the main surface of the substructure.

It is preferred that the first and second polycrystalline semiconductor layers are made of SiGe, and said third polycrystalline semiconductor layer is made of polysilicon.

With the fabrication method of the semiconductor device according to the second aspect, the semiconductor device according to the first aspect can be readily obtained.

DESCRIPTION OF THE DRAWINGS

In order that the invention may be readily carried into effect, it will now be described with reference to the accompanying drawings.

FIG. 10 is a cross-sectional view of a semiconductor device according to a third embodiment of the invention.

DETAILED DESCRIPTION OF THE PREFERRED EMBODIMENTS

Figure 1:
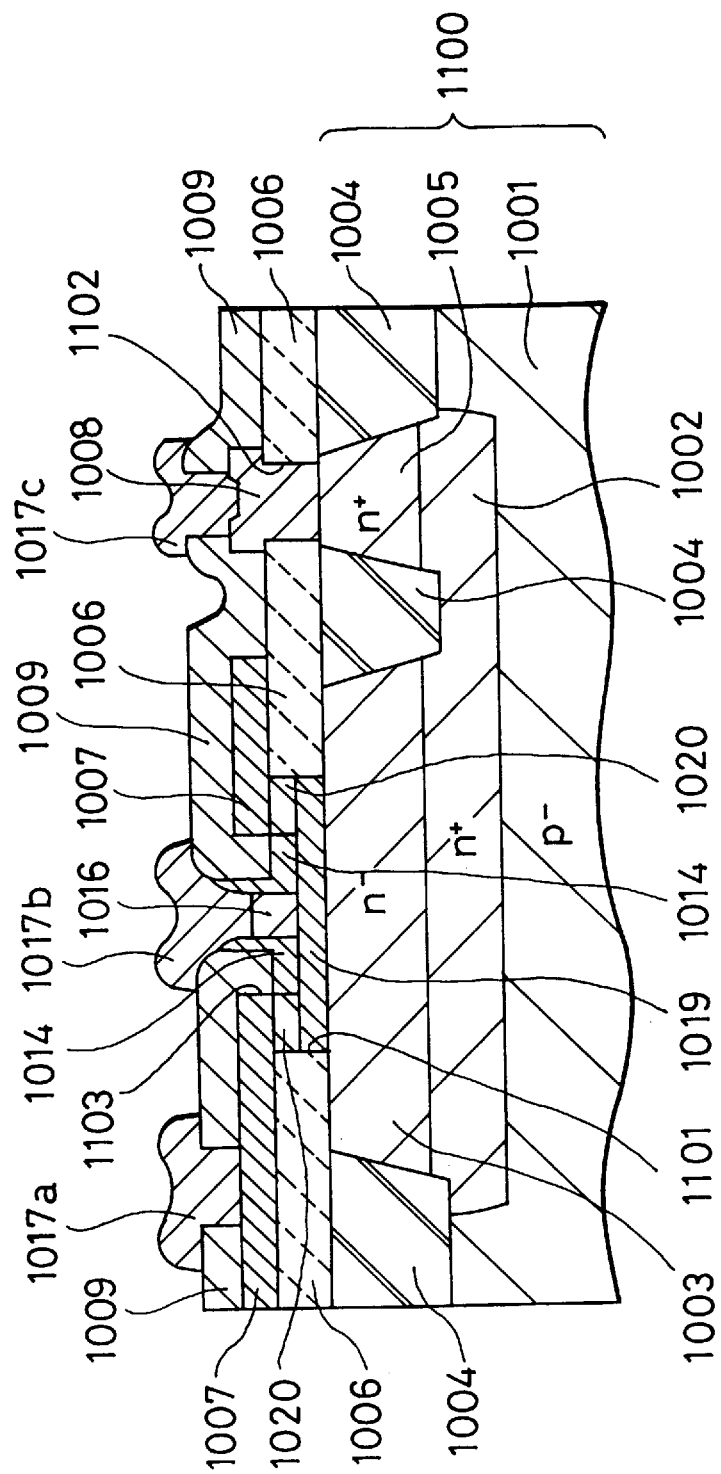
FIG. 1 is a cross-sectional view of a conventional semiconductor device.
Figure 2A:
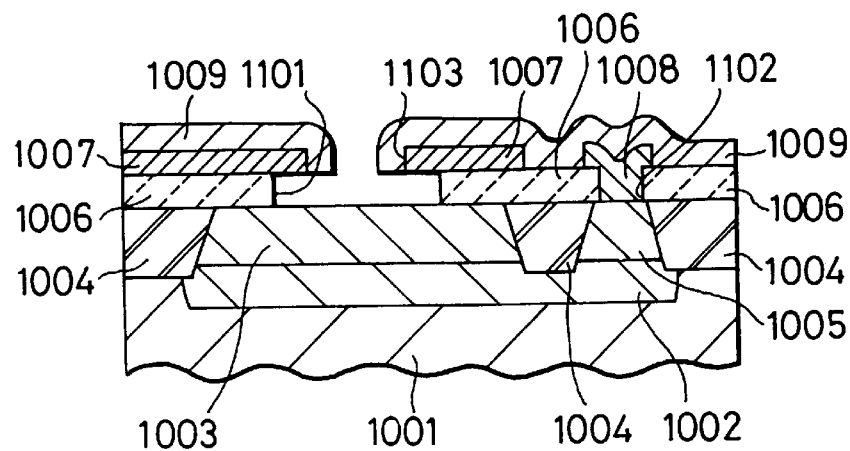
FIGS. 2A to 2C are cross-sectional views of the conventional semiconductor device of FIG. 1, which shows its fabrication process steps, respectively.
Figure 2B:
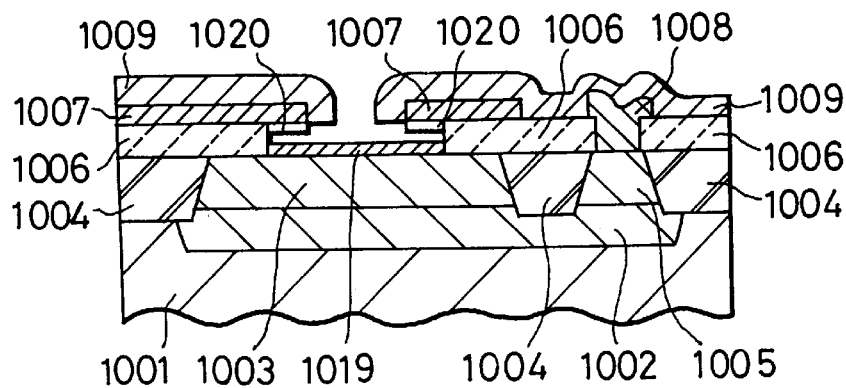
Figure 2C:
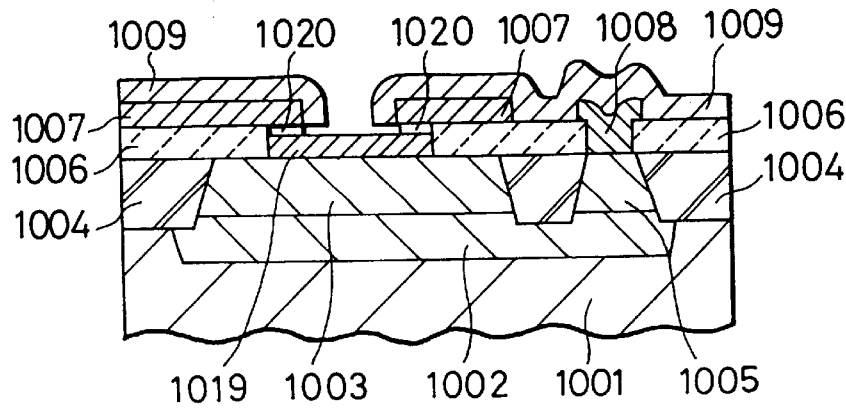

Preferred embodiments of the present invention will be described below by referring to the drawings attached.

First Embodiment

A semiconductor device according to a first embodiment of the invention includes a plurality of npn-type bipolar transistors formed in corresponding device-forming regions. However, only one of the transistors is explained here for the sake of simplification of description.

Figure 3:
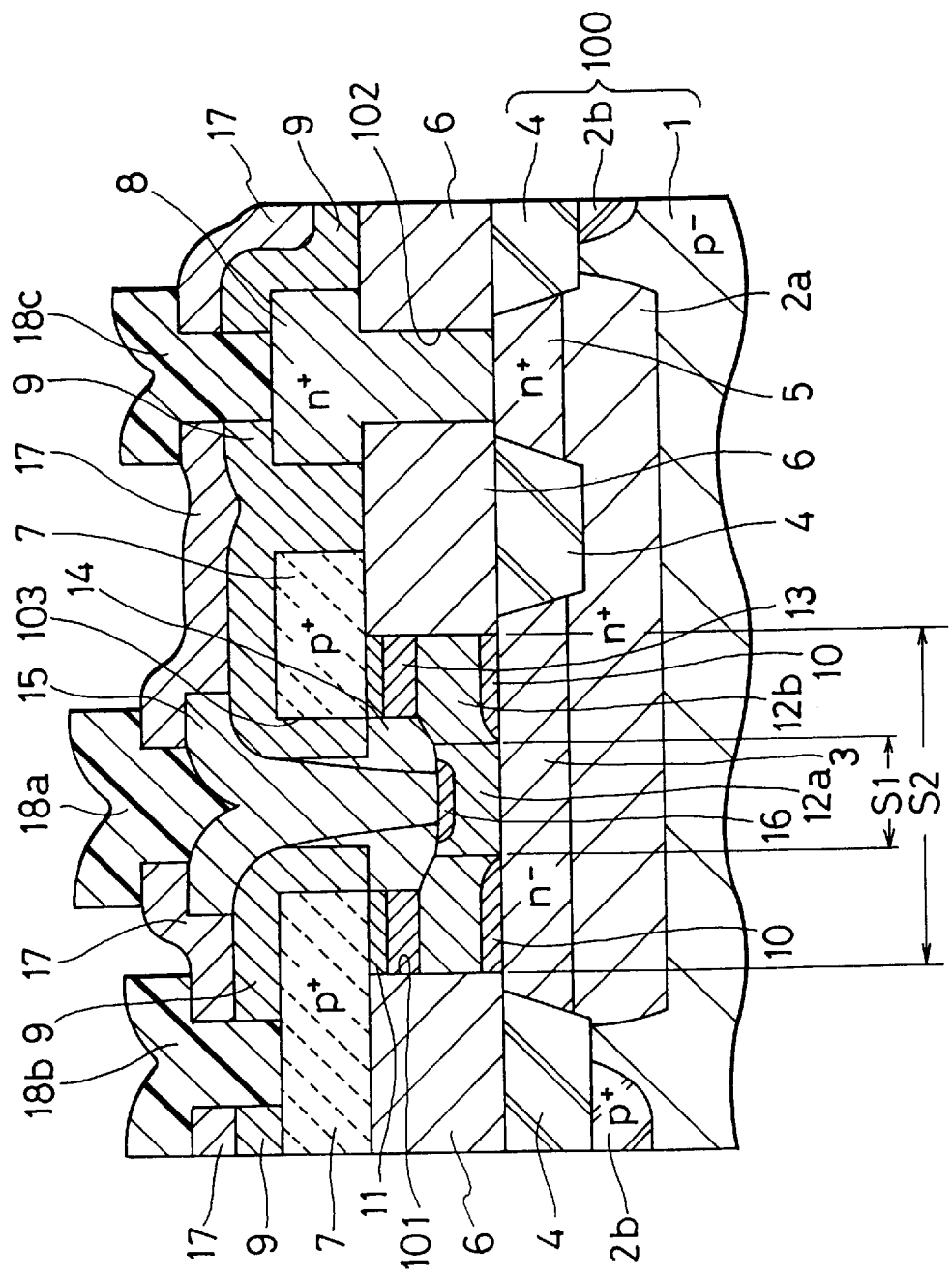
FIG. 3 is a cross-sectional view of a semiconductor device according to a first embodiment of the invention.

As shown in FIG. 3, the semiconductor device according to the first embodiment has a semiconductor base region 100 at which an npn bipolar transistor is formed. This base region 100 includes a p$^-$-type single-crystal silicon substrate 1 whose resistivity is 10 to 15 $\Omega$·cm and whose surface orientation is (100), an n$^-$-type single-crystal silicon epitaxial layer formed on the main surface or the substrate 1.

The epitaxial layer is partitioned by a patterned isolation insulating layer 4 made of SiO$_2$, thereby forming a device-forming region in which the bipolar transistor is formed. The isolation SiO$_2$ layer 4 is formed by using the LOCOS technique.

The epitaxial layer is partitioned by the isolation SiO$_2$ layer 4 to thereby form an n$^-$-type collector region 3 and an n$^+$-type collector connection region 5. An n$^+$-type buried region 2a is formed in the surface area of the substrate 1 to laterally extend from the collector region 3 to the collector connection region 5. A p$^+$-type channel stop region 2b is formed in the surface area of the substrate 1 to extend along the isolation SiO$_2$ layer 4.

The surface of the semiconductor base region 100 is covered with a SiO$_2$ layer 6 having windows 101 and 102. The window 101 is located over the collector region 3 to partially expose the region 3. The window 102 is located over the collector connection region 5 to partially expose the region 5.

A p$^+$-type polysilicon layer 7 is selectively formed on the SiO$_2$ layer 6 in the vicinity of the window 101. The layer 7 has an overhanging part which laterally overhangs the window 101, thereby forming a window 103 to be entirely overlapped with the underlying window 101. The overhanging part has a ring-like plan shape to extend along the contour of the window 101.

Within the window 101 of the SiO$_2$ layer 6, a p-type single-crystal silicon intrinsic base region 12a and a p$^+$-type polysilicon layer 10 are formed on the exposed area of the collector region 3. A p$^+$-type polysilicon extrinsic base region 12b is formed to be stacked on the p$^+$-type polysilicon layer 10.

In other words, the extrinsic base region 12b and the polysilicon layer 10 have ring-like plan shapes and extend along the ring-like overhanging part of the polysilicon layer 7. The region 12b and the layer 10 exist within an outer part of the window 101 whose distance from the inner face of the SiO$_2$ layer 6 is equal to or less than a predetermined value. The intrinsic base region 12a exists within an inner part of the window 101 whose distance from the inner face of the SiO$_2$ layer 6 is greater than the predetermined value. The intrinsic base region 12a is surrounded by the polysilicon layer 10 and the extrinsic base region 12b.

A p$^+$-type polysilicon layer 13 is wormed on the p$^+$-type extrinsic base region 12b to be stacked thereon. A p$^+$-type polysilicon layer 11 is formed on the p$^+$-type polysilicon layer 13 to be overlapped therewith.

An n$^+$-type emitter region 16 is formed on the intrinsic base region 12a. The region 16 is formed within the same single-crystal silicon layer constituting the intrinsic base region 12a through an impurity doping process into the single-crystal silicon layer.

A SiO$_2$ sidewall 14 and an n$^+$-type polysilicon emitter contact 15 are formed on the emitter region 16. The emitter contact 15 is contacted with the emitter region 16. The sidewall 14 is contacted with the emitter region 16, the intrinsic base region 12a, the extrinsic base region 12b, and the polysilicon layers 13 and 11. The SiO$_2$ sidewall 14 has a ring-like plan shape to extend around the emitter contact 15. The sidewall 14 serves to electrically insulate the emitter contact 15 from the polysilicon layers 11 and 13.

As shown in FIG. 3, the intrinsic base region 12a has a plan size or area S1 narrower than the plan size or area S2 of the window 101. This results in reduction of the contact area of the intrinsic base region 12a with the collector region 3 compared with the conventional one of FIG. 1. Also, the thickness of the region 12a is smaller than that of the SiO$_2$ layer 6.

Within the window 102 of the SiO$_2$ layer 6, an n$^+$-type polysilicon collector contact region 8 is formed to fill the window 102. The contact region 8 is contacted with the underlying collector connection region 5.

A Si$_3$N$_4$ layer 9 is formed on the polysilicon base contact region 7 to cover the region 7 itself and the exposed SiO$_2$ layer 6. The Si$_3$N$_4$ layer 9 covers not only the upper surface of the region 7 but also the inner edge of the overhanging part of the region 7. The Si$_3$N$_4$ layer 9 has base, emitter, and collector windows. The top of the emitter contact 15 projects over the layer 9.

A SiO$_2$ layer 17 is formed on the Si$_3$N$_4$ layer 9 to cover the layer 9 itself and the exposed emitter contact 15. The SiO$_2$ layer 17 has base, emitter, and collector windows formed to be overlapped with the base, emitter, and collector windows of the Si$_3$N$_4$ layer 9.

A base electrode 18b is formed on the SiO$_2$ layer 17 to be contacted with the underlying polysilicon layer 7 through the base windows of the Si$_3$N$_4$ layer 9 and the SiO$_2$ layer 17. An emitter electrode 18a is formed on the SiO$_2$ layer 17 to be contacted with the underlying emitter contact 15 through the emitter window of the SiO$_2$ layer 17. A collector electrode 18c is formed on the SiO$_2$ layer 17 to be contacted with the underlying collector contact 8 through the collector windows of the SiO$_2$ layer 17 and the Si$_3$N$_4$ layer 9.

The above-described semiconductor device according to the first embodiment is fabricated by the following process sequence.

Figure 4A:
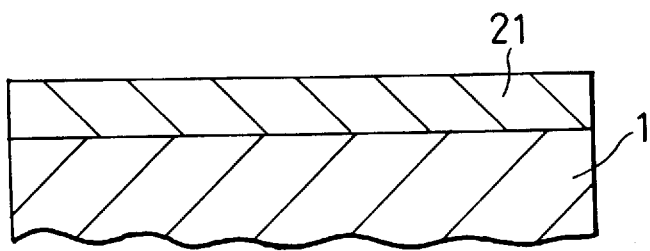
FIGS. 4A to 4T are cross-sectional views of the semiconductor device according to the first embodiment, which shows its fabrication process steps, respectively.

First, a SiO$_2$ layer 21 with a thickness of 400 to 600 nm is formed on the main surface of the p$^-$-type single-crystal silicon substrate 1 whose resistivity is 10 to 15 Ω·cm and whose surface orientation is (100), as shown in FIG. 4A. This step is performed by a conventional CVD or thermal oxidation process.

A patterned photoresist film (not shown) is then formed on the SiO$_2$ layer 21 by a conventional photolithography process. Using this patterned photoresist film as a mask, the layer 21 is selectively etched by an HF-system etching solution to thereby form an opening 21a exposing the underlying substrate 1.

Figure 4B:
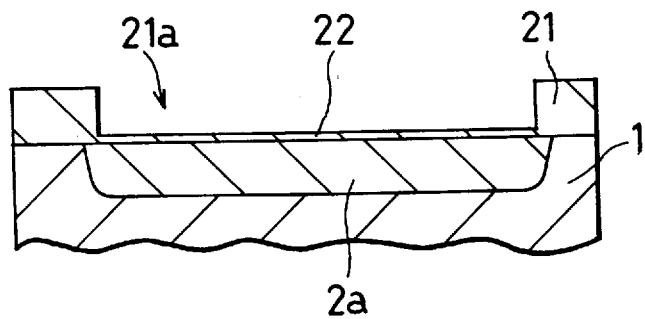

A SiO$_2$ layer 22 with a thickness of 20 to 50 nm is selectively formed on the surface of the substrate 1 within the opening 21a by a conventional thermal oxidation process, as shown in FIG. 4B.

To form the n$^+$-type buried region 2a in the substrate 1, arsenic (As) ions are selectively implanted into the substrate 1 through the opening 21a using the remaining SiO$_2$ layer 22 as a mask. This implantation process is preferably carried out under the condition that the acceleration energy is in the range from 50 kV to 120 kV, and the dose is in the range from $5 \times 10^{19}$ to $2 \times 10^{16}$ atoms/cm$^2$. The ion-implanted region is then subjected to a heat treatment process at a temperature of 1000° to 1150° C. to diffuse the implanted As ions into the undoped SiO$_2$ layer. Thus, the n$^+$-type collector buried region 2a is formed in the substrate 1, as shown in FIG. 4B.

Figure 4C:
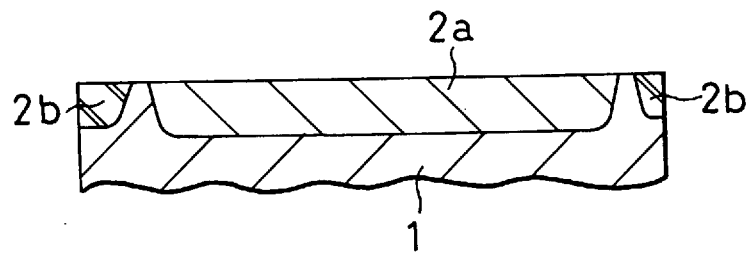

After the SiO$_2$ layer 22 and the remaining SiO$_2$ layer 21 are removed, the p$^+$-type channel stop region 2b is formed in the substrate 1 so as to surround the collector buried region 2a, as shown in FIG. 4C. This step contains formation of a patterned photoresist film, ion-implantation, removal of the photoresist film, and heat-treatment of the implanted region, which may be performed in the same way as that in the formation of the buried layer 2a.

Figure 4D:
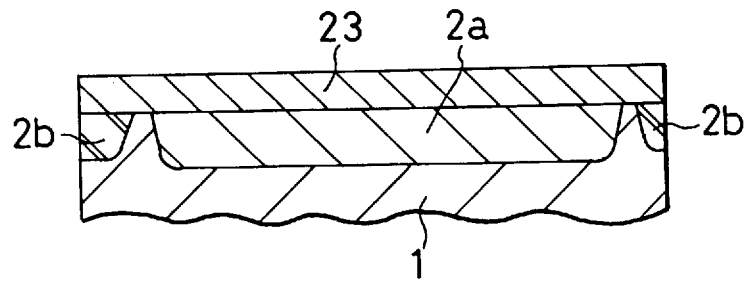

Subsequently, an n$^-$-type single-crystal silicon epitaxial layer 23 is formed on the main surface of the substrate 1 to cover the buried layer 2a and the channel stop region 2b by a conventional epitaxial growth process, as shown in FIG. 4D. A preferable growth condition is that the growth temperature is 950° to 1050° C., the source gas is SiH$_4$ or SiH$_2$Cl$_2$, and the doping gas is PH$_3$. The epitaxial layer 23 preferably has a thickness of 0.8 to 1.3 μm and a doping concentration of $5 \times 10^{15}$ to $2 \times 10^{16}$ atoms/cm$^3$.

For the purpose of device isolation, the patterned SiO$_2$ layer 4 is formed by using the known LOCOS technique in the following way.

A SiO$_2$ layer (not shown) with a thickness of 20 to 50 nm is formed on the epitaxial layer 23 by a thermal oxidation process and then, a Si$_3$N$_4$ layer (not shown) with a thickness of 70 to 150 nm is formed on the SiO$_2$ layer. A patterned photoresist film is formed on the Si$_3$N$_4$ layer, and then, the Si$_3$N$_4$ layer is selectively removed by a dry etching process, thereby patterning the Si$_3$N$_4$ layer to cover the device-forming region. After the photoresist film is removed, the epitaxial layer 3 and the substrate 1 are thermally oxidized using the patterned Si$_3$N$_4$ layer as a mask. Thus, the patterned SiO$_2$ isolation layer 4 is obtained.

The thickness of the isolation layer 4 is designed so that the bottom of the layer 4 extends to the channel stop region 2b. For example, a preferable thickness is 700 to 1000 nm.

The unnecessary, patterned Si$_3$N$_4$ layer is removed using heated phosphoric acid. Then, to reduce the collector resistance, the n$^+$-type collector connection region 5 is formed in the epitaxial layer 3 by a diffusion or ion-implantation process.

Figure 4E:
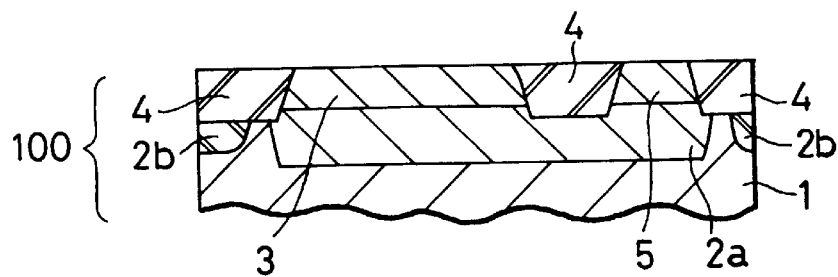

Through the above processes, the silicon substructure 100 is obtained, as shown in FIG. 4E.

Figure 4F:
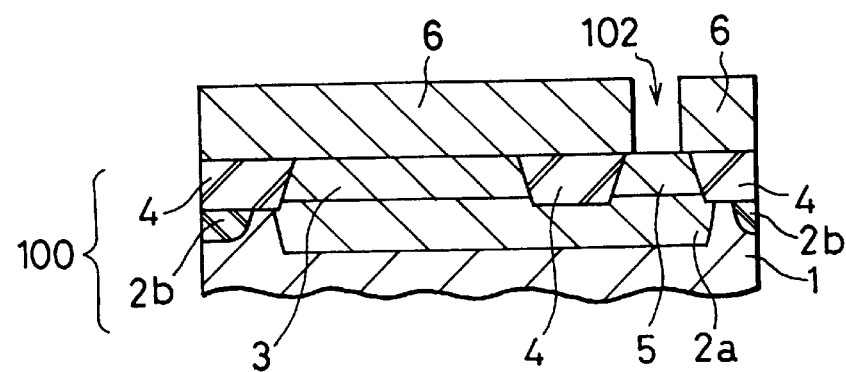

Following these processes, the SiO$_2$ layer 6 is formed on the epitaxial layer 3 to cover its entire exposed surface. It is preferred that the layer 6 has a thickness of 150 to 300 nm. Here, the thickness is set as 200 nm. The window 102 is then formed in the layer 6 to expose the underlying the collector connection region 5. The product at this stage is shown in FIG. 4F.

Figure 4G:
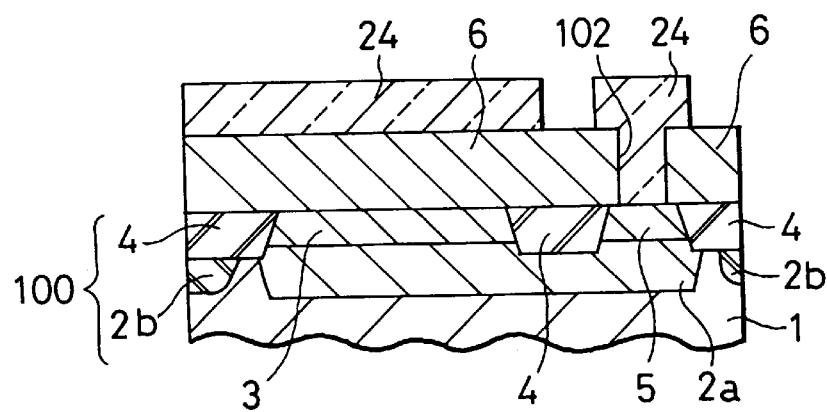

A patterned polysilicon layer 24 is formed on the SiO$_2$ layer 6, as shown in FIG. 4G. It is preferred that the layer 24 has a thickness of 200 to 350 nm. Here, the thickness is set as 250 nm. The layer 24 is contacted with the exposed collector connection region 5 through the window 102 of the SiO$_2$ layer 6.

After a patterned photoresist film (not shown) is formed on the polysilicon layer 24, boron (B) ions are selectively implanted into a part of the polysilicon layer 24 using the photoresist film as a mask, thereby forming the p$^+$-type base contact region 7. For example, the acceleration energy is set as 20 keV and the dose is set as 5×10$^{15}$ atoms/cm$^2$.

Figure 4H:
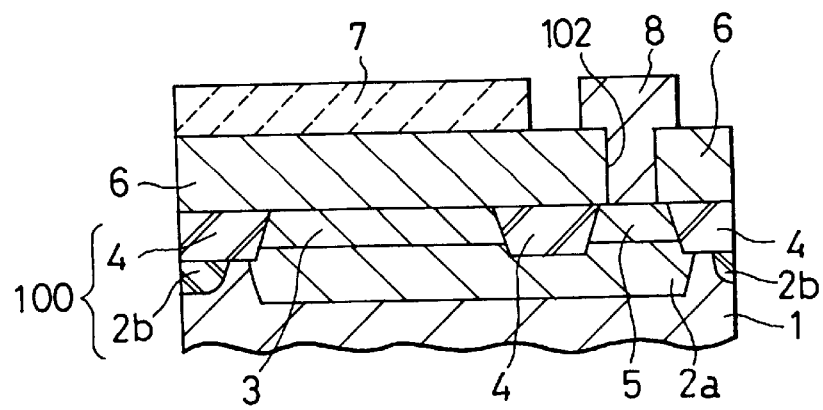

After this photoresist film is removed, another patterned photoresist film (not shown) is formed on the polysilicon layer 24, phosphorus (P) ions are selectively implanted into another part of the polysilicon layer 24 using the photoresist film as a mask, thereby forming the n$^+$-type collector contact region 8. For example, the acceleration energy is set as 50 keV and the dose is set as 1×10$^{16}$ atoms/cm$^2$. The product at this stage is shown in FIG. 4H.

Subsequently, a Si$_3$N$_4$ layer 25 with a thickness of approximately 150 nm is formed to cover the polysilicon base and collector contact regions 7 and 8 over the entire substrate 1 by an LPCVD process. The thickness of the layer 24 is preferably in the range from 100 to 200 nm.

Figure 4I:
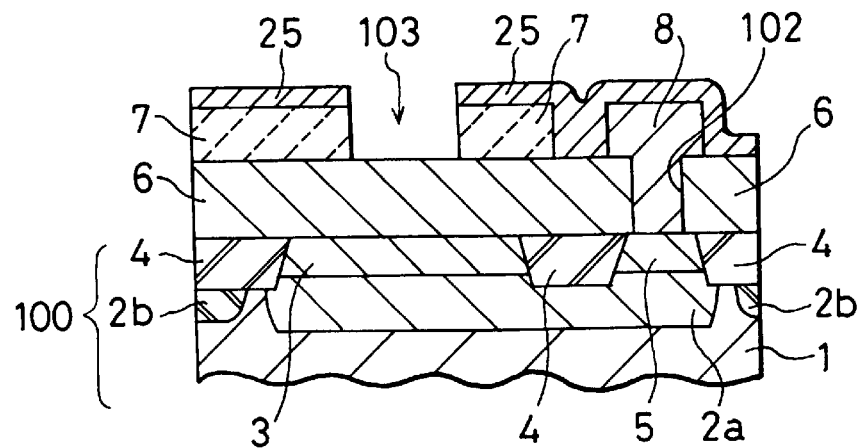

A patterned photoresist film (not shown) having a window at the emitter-forming position is formed on the Si$_3$N$_4$ layer 25 by a conventional photolithography process. Using this patterned photoresist film as a mask, the Si$_3$N$_4$ layer 25 and the polysilicon base contact region 7 are selectively and successively etched by anisotropic dry etching processes. Thus, the window 103 is formed in the base contact region 7, as shown in FIG. 4I.

Another Si$_3$N$_4$ layer (not shown) with a thickness of 50 to 100 nm is formed on the remaining Si$_3$N$_4$ layer 25 over the entire substrate 1 by an LPCVD process. This newly-formed Si$_3$N$_4$ layer is contacted with the exposed SiO$_2$ layer 6 and the side face of the base contact region 7 within the window 103.

Figure 4J:
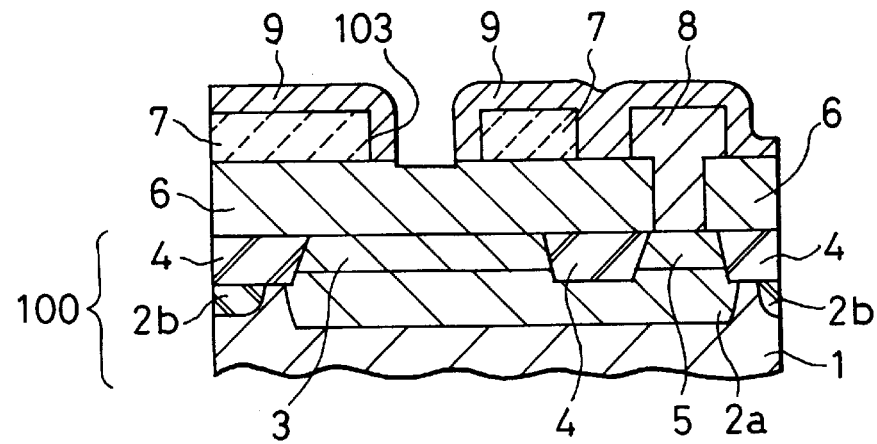

The newly-formed Si$_3$N$_4$ layer is selectively etched at the bottom of the window 103 by an anisotropic dry etching process. As shown in FIG. 4J, the remaining Si$_3$N$_4$ layer 25 and the remaining, newly-formed Si$_3$N$_4$ layer constitute the Si$_3$N$_4$ layer 9. The layer 9 covers the side face of the base contact region 7 within the window 103.

Figure 4K:
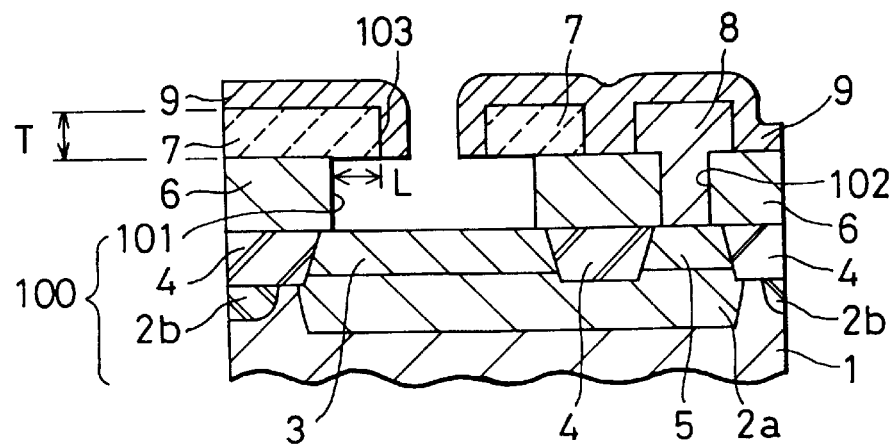

Further, using an etching solution containing hydrogen fluoride (HF), the SiO$_2$ layer 6 is selectively etched by a wet etching process through the window 103, thereby forming the window 101 in the layer 6, as shown in FIG. 4K. The underlying collector region 3 is exposed through the window 101. The window 101 is formed to be overlapped with the entire window 103.

During this wet etching process, the SiO$_2$ layer 6 is etched vertically and laterally. Therefore, the window 101 has a wider plan size or area than that of the window 103, resulting in the overhanging part of the p$^+$-type polysilicon base contact region 7, as shown in FIG. 4K.

The length L of the overhanging part of the SiO$_2$ layer 6 may be smaller than the thickness T of the layer 6. The length T is preferable in the range from 100 to 250 nm. Here, T=250 nm and L=200 nm.

Figure 4L:
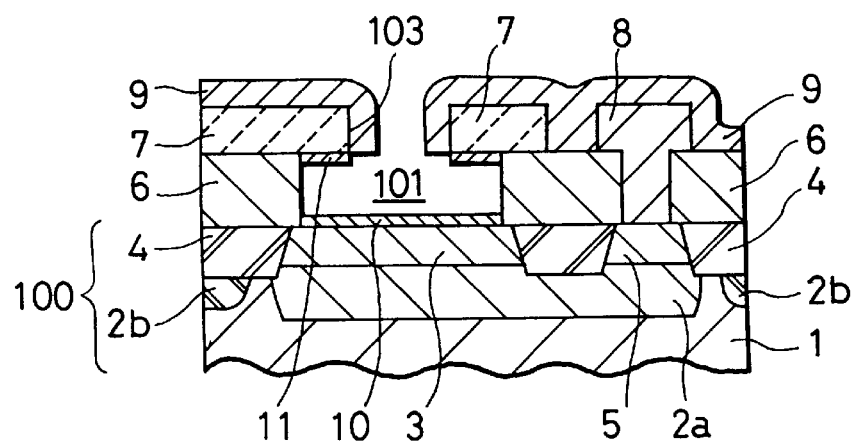

Next, by a selective polysilicon growth process, an undoped polysilicon layer 10 is grown upward on the exposed surface of the n$^+$-type single-crystal silicon collector region 3, and at the same time, an undoped polysilicon layer 11 is grown downward on the exposed lower surface of the overhanging part of the p$^+$-type polysilicon base contact region 7 within the window 101. The product at this stage is shown in FIG. 4L.

A preferred example of this selective polysilicon growth process is disclosed by T. Aoyama, et al., in the article, Extended Abstract on Solid State Devices and Materials, pp. 658–668, entitled "Selective Polysilicon Deposition (SPD) by Hot-Wall LPCVD and Its Application to High Speed Bipolar Devices", which was published in 1990.

Here, an LPCVD process is performed under the condition that SiH$_2$Cl$_2$ and HCl are supplied at the respective flow rates of 300 sccm and 160 sccm as the source gas, the growth pressure is set as 30 Torr, and the growth temperature is set as 800° C. The undoped polysilicon layers 10 and 11 have the same thickness of approximately 30 nm.

Figure 4M:
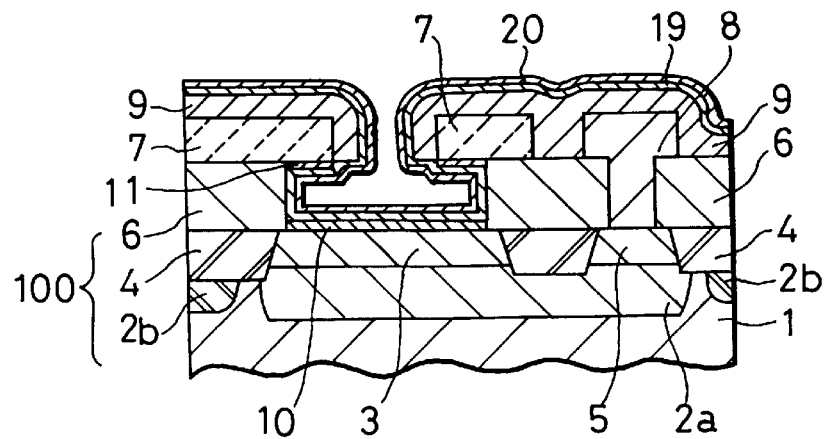

A SiO$_2$ layer 19 and a Si$_3$N$_4$ layer 20 are successively formed on the Si$_3$N$_4$ layer 9 by LPCVD processes. These two layers 19 and 20 have the same thickness of approximately several tens nanometers. At this stage, as shown in FIG. 4M, the layers 19 and 20 covers all the exposed areas within the windows 101 and 103.

Figure 4N:
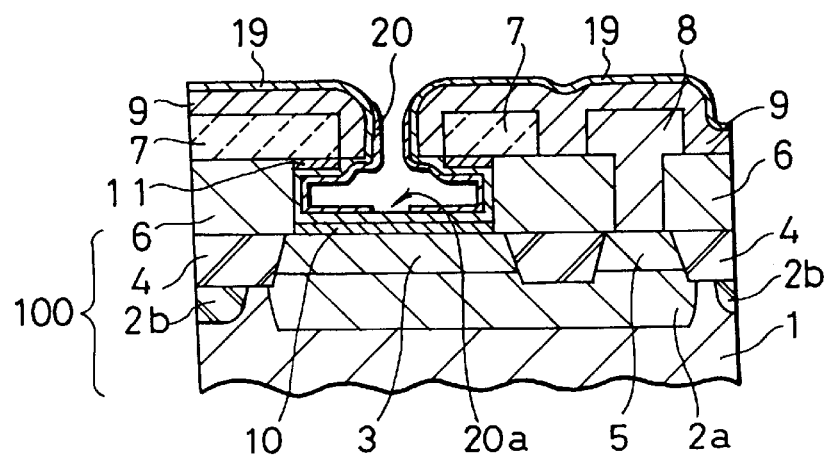

The Si$_3$N$_4$ layer 20 is selectively removed by an anisotropically dry etching process at the location right beneath the window 103, thereby forming a window 20$a$ in the layer 20. The underlying SiO$_2$ layer 19 is partially exposed through the window 20$a$, as shown in FIG. 4N.

Figure 4O:
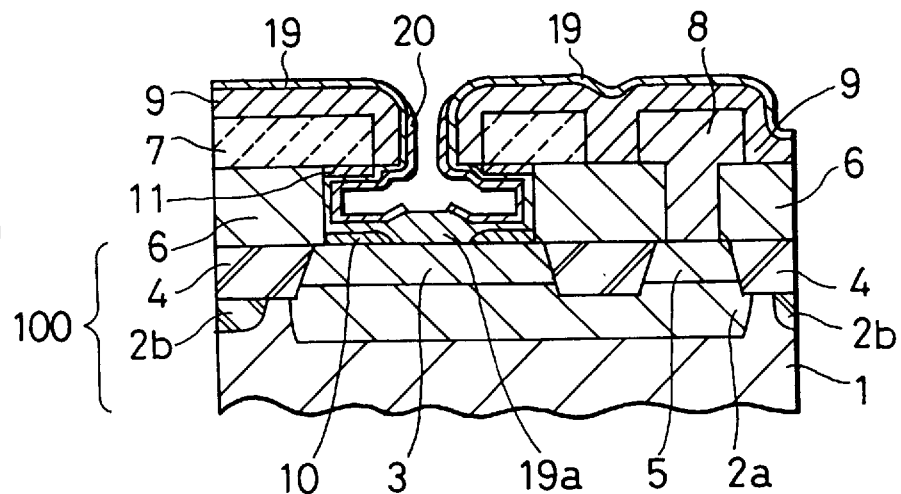

Using the etched Si$_3$N$_4$ layer 20 as a mask, the undoped polysilicon layer 10 is selectively oxidized in an oxidizing atmosphere until the corresponding part of the polysilicon layer 10 is completely oxidized to become SiO$_2$. As a result, as shown in FIG. 4O, the SiO$_2$ layer 19 and the SiO$_2$ layer generated by this oxidation process are combined with each other, thereby forming an expanded part 19$a$ on the collector region 3 in the vicinity of the window 20$a$.

Then, the Si$_3$O$_4$ layer 20 is removed by using heated phosphoric acid, and the SiO$_2$ layer 19 is removed by using HF solution, successively. The state at this stage is shown in FIG. 4P.

Figure 4P:
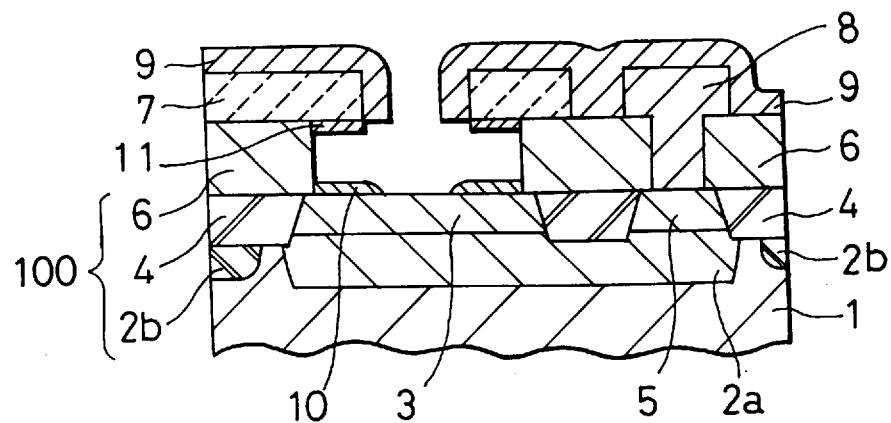

It is seen from FIG. 4P that the collector region 3 is partially exposed at the area corresponding to the expanded part 19$a$, and that the remaining undoped polysilicon layer 10 has a ring-like plan shape.

Figure 4Q:
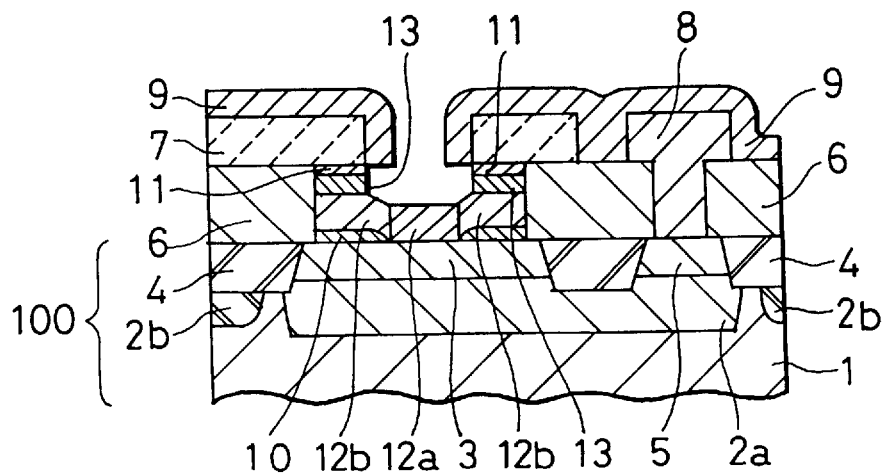

Following this step, an epitaxial growth process as in the above-described conventional method is performed to thereby form the intrinsic base region 12$a$, the extrinsic base region 12$b$, and the polysilicon layer 13 are simultaneously formed, as shown in FIG. 4Q. Specifically, the p-type single-crystal silicon intrinsic base region 12$a$ is grown upward on the exposed collector region 3. The p-type polysilicon extrinsic base region 12$b$ is grown upward on the remaining ring-shaped polysilicon layer 10. The p-type polysilicon layer 13 is grown downward on the undoped polysilicon layer 11. This epitaxial growth process is continued until the extrinsic base region 12$b$ and the p-type polysilicon layer 13 are contacted with each other.

As the epitaxial growth process, one of LPCVD, gas-source MBE or UHV-CVD processes may be used. Here, a UHV-CVD process is performed under the condition that the $Si_2H_6$ is supplied at a flow rate of 3 sccm as the source gas, and the growth temperature is set as 605° C.

Subsequently, a heat treatment process is performed to heavily dope a p-type impurity into the polysilicon layers 11, 13 and 12b within the window 101. Specifically, the $p^+$-type base contact region 7 is heavily doped with boron atoms and therefore; the boron atoms doped into the region 7 are diffused downward, thereby entering the underlying polysilicon layers 11, 13 and 12b. Thus, the polysilicon layers 11, 13 and 12b are heavily doped with boron atoms, resulting in the $p^+$-type polysilicon layers.

This heat treatment process is preferably performed under the condition that the heating temperature is 800° C. and the heating time is 10 minutes.

Typically, the diffusion coefficient (ie., diffusion speed) within a polysilicon material is greater than that within a single-crystal silicon material. Therefore, the polysilicon layers can be doped with the boron atoms at a satisfactorily high level due to this heat treatment process.

There is a possibility that the polysilicon layer 10 also is doped with the boron atoms during this heat treatment process. However, this doping will cause no problem relating the performance of the bipolar transistor.

During this heat treatment process, the boron atoms diffuse into the surface area of the collector region 3, which results in some increase of the effective thickness of the intrinsic base region 12a. However, such the thickness increase of the region 12a is not shown in FIG. 4Q for the sake of simplification.

Figure 4R:
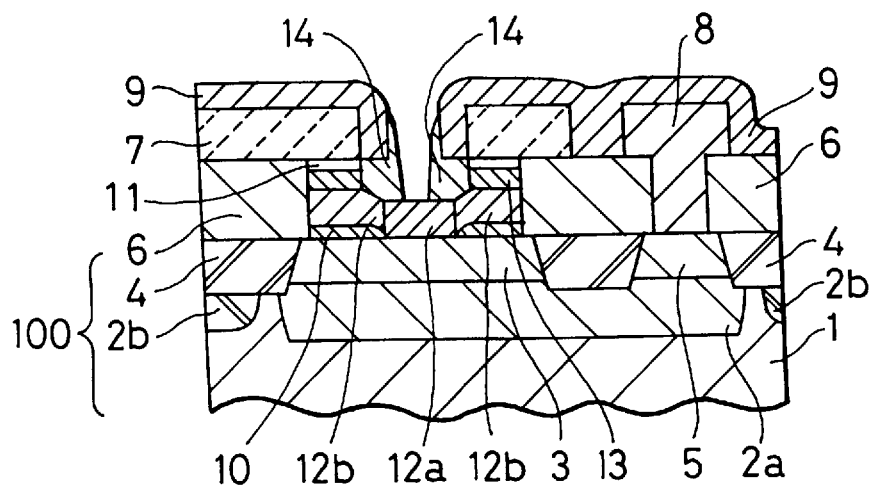

Further, a $SiO_2$ layer 14 is formed on the $Si_3N_4$ layer 9 by an LPCVD process and then, the layer 14 is selectively removed by an anisotropically etching process, thereby forming the $SiO_2$ sidewall 14 having a ring-like plan shape, as shown in FIG. 4R. The bottom face of the sidewall 14 is contacted with the intrinsic base region 12a and the extrinsic base region 12b. The outer side face of the sidewall 14 is contacted with the polysilicon layer 11 and 13, and the $Si_3N_4$ layer 9. The underlying intrinsic base region 12a is exposed at the center of the sidewall 14.

An undoped polysilicon layer (not shown) is formed on the $Si_3N_4$ layer 9 to be contacted with the sidewall 14 by an LPCVD process. The polysilicon layer is then doped with arsenic atoms by an ion-implantation process to reduce its resistivity. The thickness of this polysilicon layer is preferably in the range from 150 to 300 nm. The ion implantation process is preferably performed under the condition that the acceleration energy is set as 70 to 100 keV to avoid penetration of the arsenic ions and that the dose is set as $5 \times 10^{15}$ to $2 \times 10^{16}$ atoms/cm$^2$.

Figure 4S:
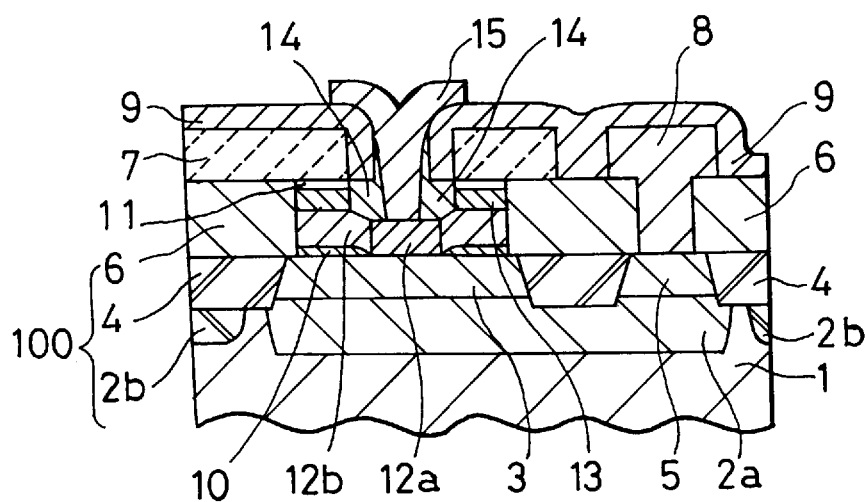

The arsenic-doped polysilicon layer is then patterned by photolithography and dry etching processes, thereby forming the emitter contact 15, as shown in FIG. 4S. The emitter contact 15 is electrically Isolated from the polysilicon layers 11 and 13 by the $SiO_2$ sidewall 14. The bottom of the contact 15 is contacted with the exposed intrinsic base region 12a.

Figure 4T:
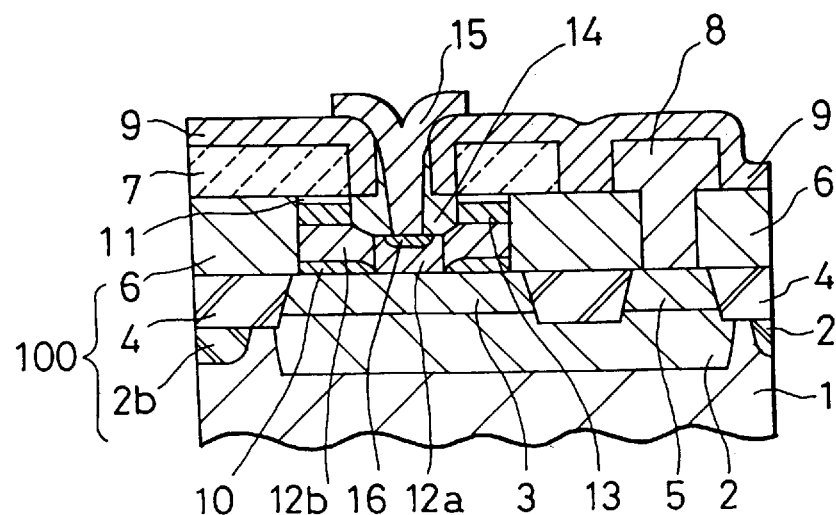

To form the n-type emitter region 16, a heat treatment process is performed. Due to this heat treatment process, the arsenic atoms doped into the emitter contact 15 are diffused into the surface area of the p-type intrinsic base region 12a through their contact area. The conductivity type of the arsenic-doped region is changed to n-type, resulting in the n-type emitter region made of single-crystal silicon, as shown in FIG. 4T.

Further, the $SiO_2$ layer 17 is formed to cover the $Si_3N_4$ layer 9 and the emitter contact 15. The $SiO_2$ layer 17 and the underlying $Si_3N_4$ layer 9 are patterned to have the base, emitter, and collector openings at specific locations, respectively.

An aluminum (Al) alloy layer is formed on the patterned $SiO_2$ layer 17 by a sputtering process. The Al-alloy layer is patterned by photolithography and anisotropically dry etching processes to thereby from the emitter, base, and collector electrodes 18a, 18b, and 18c. The emitter electrode 18a is contacted with the emitter contact 15 through the emitter opening. The base electrode 18b is contacted with the base contact 7 through the base opening. The collector electrode 18c is contacted with the collector contact 8 through the collector opening.

Through the above processes, the semiconductor device including the bipolar transistor as shown in FIG. 3 is fabricated.

With the semiconductor device according to the first embodiment of FIG. 3, the extrinsic base region 12b and the polysilicon layers 13 and 11 serving as the base connection region are located between the intrinsic base region 12a and the base contact region 7. In other words, the intrinsic base region 12a and the base contact region 7 are electrically connected with each other through the combination of the extrinsic base region 12b and the polysilicon layers 13 and 11.

The extrinsic base region 12b is made of the boron-doped polysilicon and the doping concentration of the boron atoms is determined so that the region 12b is lower in electric resistance than the case where it is made of single-crystal silicon.

As a result, the base resistance, which is defined as the sum of the electric resistance values of the combination of the extrinsic base region 12b and the polysilicon layers 13 and 11, can be reduced compared with the above-described conventional semiconductor device of FIG. 1.

It is needless to say that if the doping concentrations are equal, a polysilicon layer is higher in electric resistance than a single-crystal silicon layer. However, in the first embodiment, the polysilicon extrinsic base region 12b is heavily doped with boron during a heat treatment after its growth process. The doping concentration of the extrinsic base region 12b after the heat treatment is greater than that in its growth process by approximately one order and consequently, the region 12b enables the base resistance reduction and high-speed operation of the bipolar transistor.

Since the value of the base resistance varies dependent upon its dimension, the comparison of the value itself is meaningless. Roughly speaking, the base resistance is equal to the sum resistance of three parts; i.e., (a) intrinsic base region, (b) base contact region, and (c) base connection region between the intrinsic base region and the base contact region; and the resistance values of the three parts are approximately equal.

The maximum oscillation frequency $f_{max}$ of the bipolar transistor is inversely proportional to the square root of the base resistance $R_8$. Therefore, when the base resistance $R_8$ of the semiconductor device according to the first embodiment is compared with the conventional one shown in FIG. 1 using the maximum oscillation frequency $f_{max}$, the device of the first embodiment has an increased $f_{max}$ of 46 GHz greater than 40 GHz for the conventional one.

Second Embodiment

Figure 5:
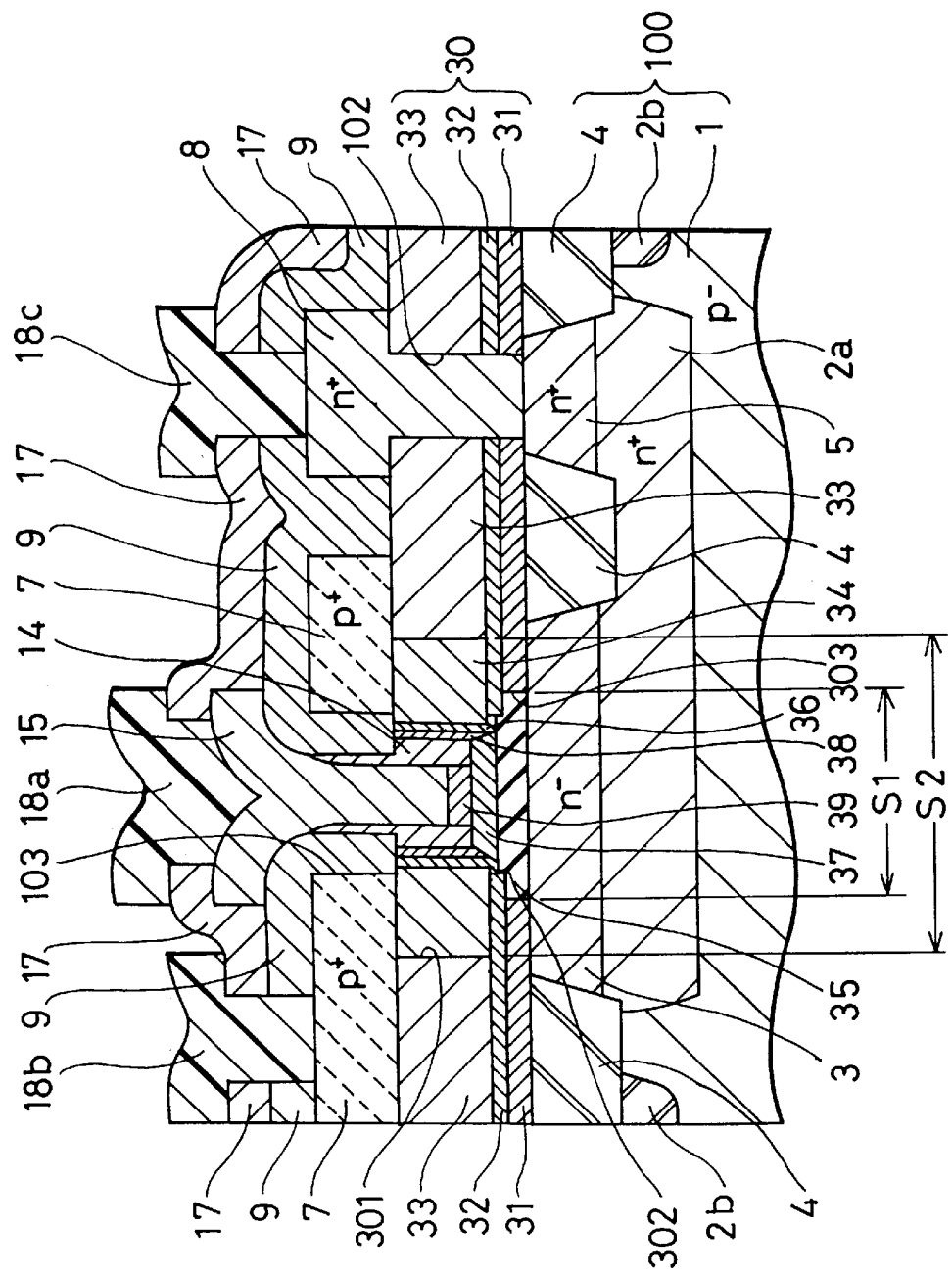
FIG. 5 is a cross-sectional view of a semiconductor device according to a second embodiment of the invention.

FIG. 5 shows a semiconductor device according to a second embodiment of the invention.

The second embodiment includes the same structure and method as those of the first embodiment and therefore, the description relating to the same structure and method is omitted here by adding the same reference numerals to the corresponding elements for the sake of simplification of description.

As shown in FIG. 1, the surface of the silicon substructure 100 is covered with a three-layer insulating structure 30 made of a $SiO_2$ layer 31 located as the bottom layer, a $Si_3N_4$ layer 32 located at a middle layer, and a $SiO_2$ layer 33 located as the top layer.

The window 102 vertically penetrates the three-layer insulating structure 30 to expose the collector connection region 5. Instead of the window 101 of the $SiO_2$ layer 6 in the first embodiment, a window 301 is formed in the $SiO_2$ layer 33, a window 302 is formed in the $Si_3N_4$ layer 32, and a window 303 is formed in the $SiO_2$ layer 31. The top layer window 301 is the largest, the middle layer window 302 is the smallest, and the bottom layer window 303 is middle in size of the three windows 301, 302 and 303. These three windows 301, 302 and 303 are overlapped with each other to expose the underlying collector region 3 from the three-layer insulating structure 30.

The $p^+$-type polysilicon base contact region 7 is contacted with the $SiO_2$ layer 33, The overhanging part of the base contact region 7 overhangs the top layer window 301 of the $SiO_2$ layer 33.

A $p^+$-type polysilicon layer 34 having a ring-like plan shape is formed within the window 301 between the polysilicon base contact 7 and the $Si_3N_4$ layer 32. The top and bottom of the layer 34 are contacted with the base contact 7 and the layer 32, respectively, and the outer side face of the layer 34 is contacted with the $SiO_2$ layer 33.

A p-type single-crystal SiGe layer 35 is formed on the exposed collector region 3 within the window 303. The periphery of the layer 35 is contacted with the $SiO_2$ layer 31 and the $Si_3N_4$ layer 32. The top face of the layer 35 is approximately level with the midpoint of thickness of the layer 32.

A p-type single-crystal SiGe extrinsic base region 37 is formed on the p-type single-crystal SiGe layer 35. The top of the layer 37 is within the upper window 301. The layer 37 is smaller in plan size than the layer 35.

A $p^+$-type polycrystalline SiGe layer 36 having a thin, ring-like plan shape is formed to be contacted with the $p^+$-type polysilicon layer 34 within the windows 301 and 302. The SiGe layer 36 extends along the ring-shaped polysilicon layer 34 and surrounds the intrinsic base region 37.

A p-type polycrystalline SiGe layer 38 having a thin, ring-like plan shape is formed to be contacted with the SiGe layer 36 within the windows 301 and 302. The SiGe layer 38 extends along the ring-shaped polysilicon layer 34 and surrounds the intrinsic base region 37.

The SiGe layers 36 and 38 are located beneath the $Si_3N_4$ layer 9. The bottoms of the layers 36 and 38 are contacted with the SiGe intrinsic base region 37. The inner end of the polysilicon layer 34, which laterally projects into the window 301, is located beneath the $Si_3N_4$ layer 9.

An $n^+$-type single-crystal silicon emitter region 39 is formed on the intrinsic base region 37. The emitter contact region 15 is formed to on the emitter region 39 to be contacted therewith.

The ring-like $SiO_2$ sidewall 14 is formed on the intrinsic base region 37 to extend along the ring-shaped polysilicon layer 34. The sidewall 14 electrically insulates the emitter region 39 and the emitter contact 15 from the p-type polycrystalline SiGe layer 38.

Here, the SiGe layer 35 is of p-type. However, the layer 35 may be of p- or n-type. When the layer 35 is of n-type, it serves as an additional part of the n-type collector region 3. When the layer 35 is of p-type, it serves as an additional part of the p-type intrinsic base region 37.

As shown in FIG. 5, the SiGe layer 35 serving as a part of the intrinsic base region has a plan size or area S1 narrower than the plan size or area S2 of the window 301. This results in reduction of the contact area of the SiGe layer 35 with the collector region 3 compared with the conventional one of FIG. 1. The thickness of the layer 33 is smaller than the sum thickness of the $SiO_2$ layer 31, the $Si_3N_4$ layer 32, and the $SiO_2$ layer 33.

In the second embodiment, "SiGe", which means Ge-doped Si material, is used. Therefore, an electric field is generated with in a SiGe layer by changing its Ge concentration and as a result, carriers in the SiGe layer can be accelerated due to the electric field. This leads to high-speed operation.

The above-described semiconductor device according to the second embodiment is fabricated by the following process sequence.

Figure 6A:
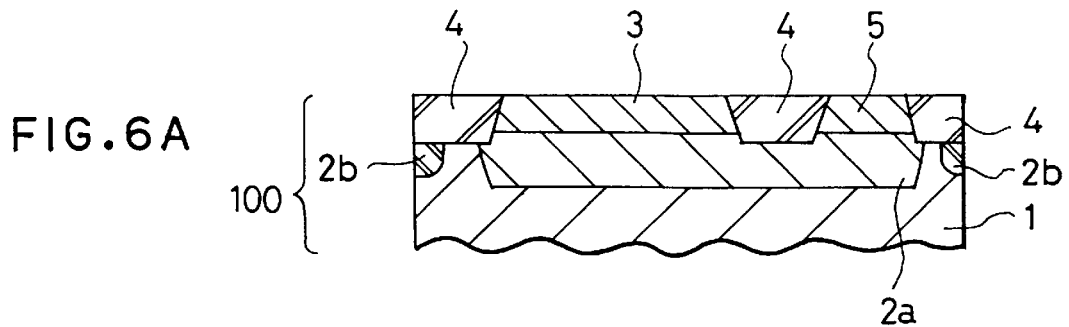
FIGS. 6A to 6L are cross-sectional views of the semiconductor device according to the second embodiment, which shows its fabrication process steps, respectively.

First, the silicon substructure 100 as shown in FIG. 6A is formed in the same way as that of the first embodiment.

Next, the $SiO_2$ layer 31 with a thickness of 15 nm is formed on the epitaxial layer to cover its entire exposed surface by a thermal oxidation or CVD process. Preferably, the layer 31 has a thickness of 10 to 50 nm.

The $Si_3N_4$ layer 32 with a thickness of 15 nm is formed on the $SiO_2$ layer 31 by a LPCVD process. Preferably, the layer 32 has a thickness of 10 to 50 nm.

It is preferred that the sum of the thickness of the $SiO_2$ and $Si_3N_4$ layers 31 and 32 is approximately equal to the thickness of an undoped SiGe layer 35 which will be formed in a subsequent step.

Figure 6B:
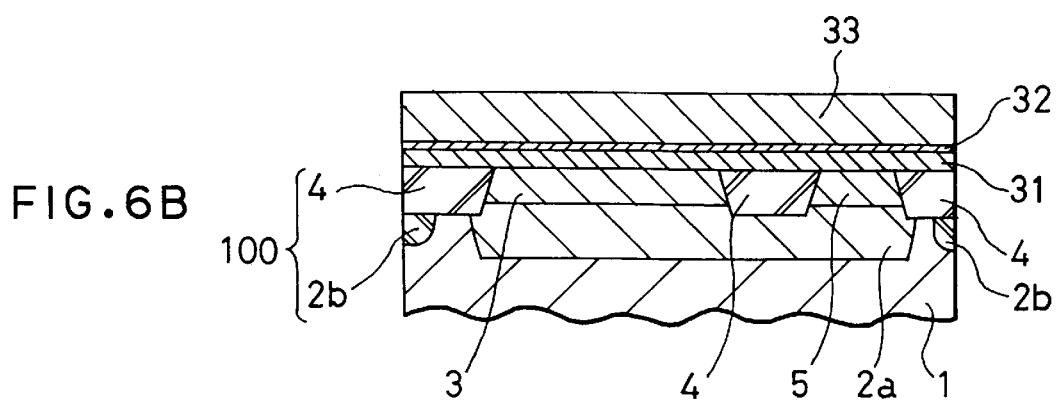

The $SiO_2$ layer 33 with a thickness of 120 nm is formed on the $Si_3N_4$ layer 32 by a CVD process. Preferably, the layer 33 has a thickness of 70 to 150 nm. The state at this stage is shown in FIG. 6B.

Figure 6C:
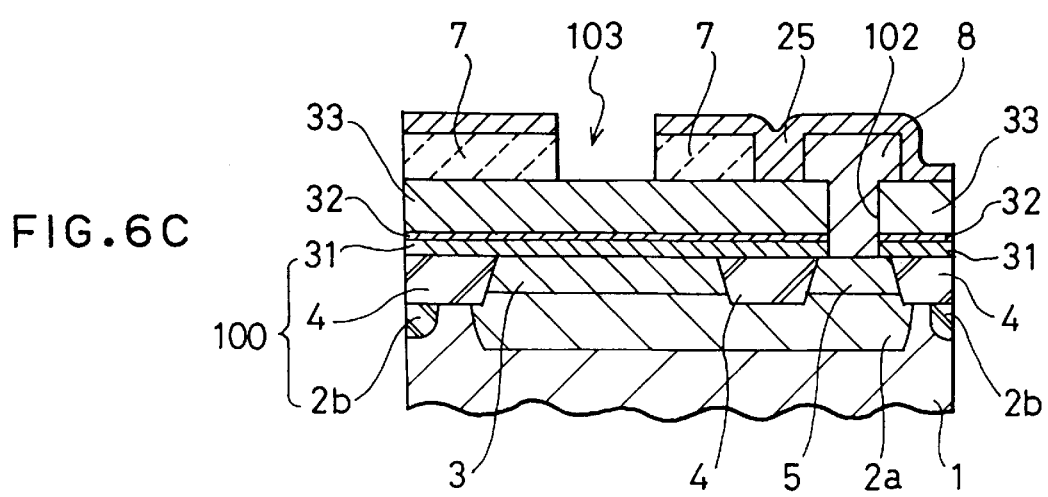

Subsequently, in the same way as that of the first embodiment, the polysilicon base contact 7 and the polysilicon collector contact 8 are formed on the $SiO_2$ layer 33. The $Si_3N_4$ layer 25 is formed to cover the contacts 7 and 8 and the exposed $SiO_2$ layer 33. The window 103 is formed in the base contact 7 by photolithography and dry etching process. The product at this stage is shown in FIG. 6C.

Figure 6D:
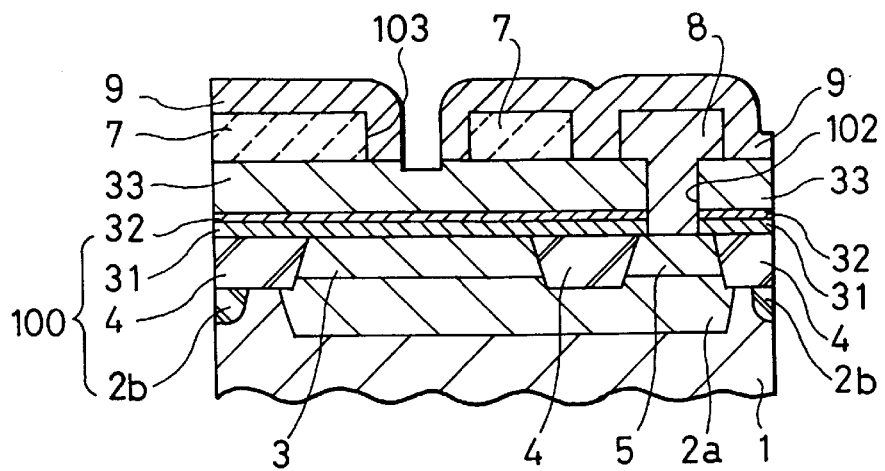

Further, in the same way as that of the first embodiment, the $Si_3N_4$ layer 9 is formed to cover the contacts 7 and 8 and the exposed $SiO_2$ layer 33. The layer 9 is then etched back to expose the underlying layer 33 at the bottom of the window 103. The layer 9 covers the side face of the base contact region 7 within the window 103. The product at this stage is shown in FIG. 6D.

Figure 6E:
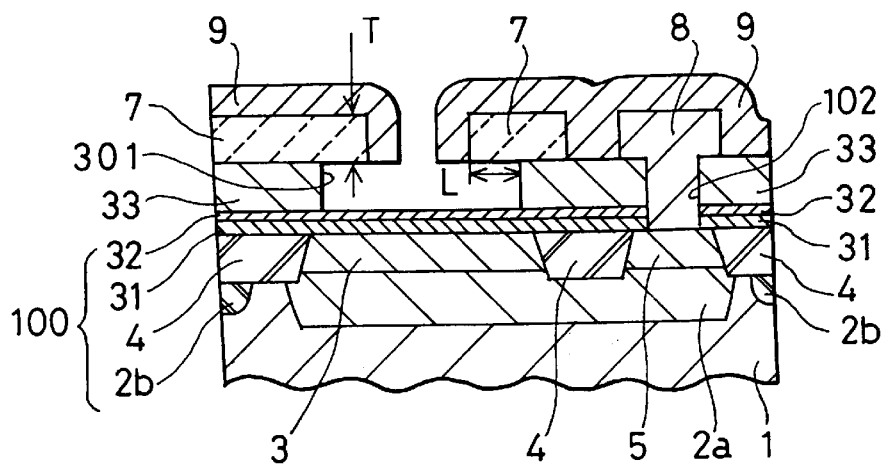

Subsequently, using an HF-containing etching solution, the $SiO_2$ layer 33 is selectively etched by a set etching process through the window 103, thereby forming the window 301 in the layer 33, as shown in FIG. 6E. The underlying $Si_3N_4$ layer 32 is exposed through the window 301.

During this wet etching process, the $SiO_2$ layer 33 is etched vertically and laterally so that the overhanging part of the $p^+$-type polysilicon base contact region 7 is formed, as shown in FIG. 6E.

It is not necessary that the length L of the overhanging part of the SiO$_2$ layer 33 is equal to or greater than the thickness T of the layer 33. The length T is preferable in the range from 100 to 250 nm. Here, T=250 nm and L=200 nm.

During this wet etching process, the underlying Si$_3$N$_4$ layers 32 and 9 are scarcely affected by the etching action and therefore, their configuration is kept almost unchanged.

Next, in the same way as that of the first embodiment, an undoped polysilicon layer 10 is grown by an LPCVD process. Instead of the LPCVD process, a gas-source MBE or UHV-CVD process may be used. During this growth process, an undoped polysilicon layer is selectively grown downward on the lower face of the overhanging part of the base contact region 7 within the window 301 until it is contacted with the Si$_3$N$_4$ layer 32. Thus, the undoped polysilicon layer 34 having a ring-like plan shape is formed along the overhanging part, as shown in FIG. 6F.

To diffuse the impurity (i.e., boron atoms) contained in the p$^+$-type polysilicon base contact 7 into the undoped polysilicon layer 34, a heat treatment process is then performed. As a result, the conductivity type of the polysilicon layer 34 is changed to p$^+$-type. The state at this stage is shown in FIG. 6F.

Figure 6F:
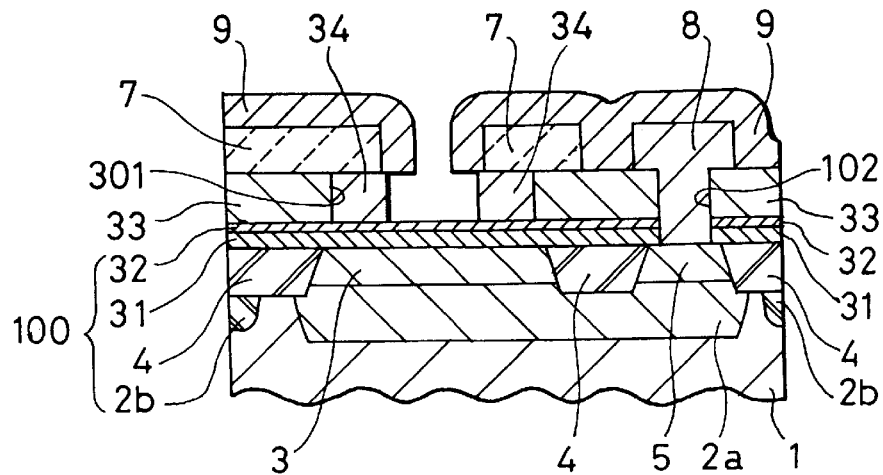
Figure 6G:
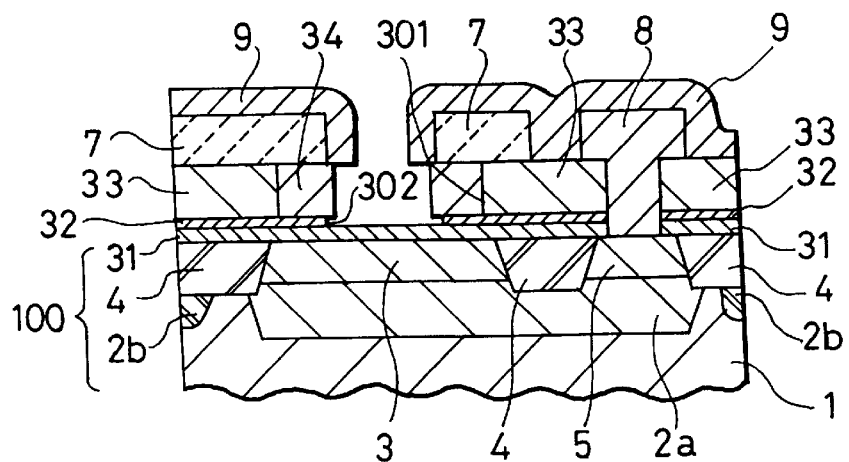

This heat treatment process is, for example, carried out at a temperature of 900° C. for 30 minutes, Further, to selectively remove the Si$_3$N$_4$ layer 32 at its exposed area, the entire base region 100 in the state of FIG. 6F is dipped into a heated phosphoric acid. As a result, the exposed area of the layer 32 is etched to form the window 302, as shown in FIG. 6G.

During this wet etching process, the Si$_3$N$_4$ layer 9 also is etched, resulting in thickness reduction. However, this causes no problem if the layer 9 is formed to have an extra thickness during the prior formation process. The thickness reduction is ignored in FIG. 6G.

Figure 6H:
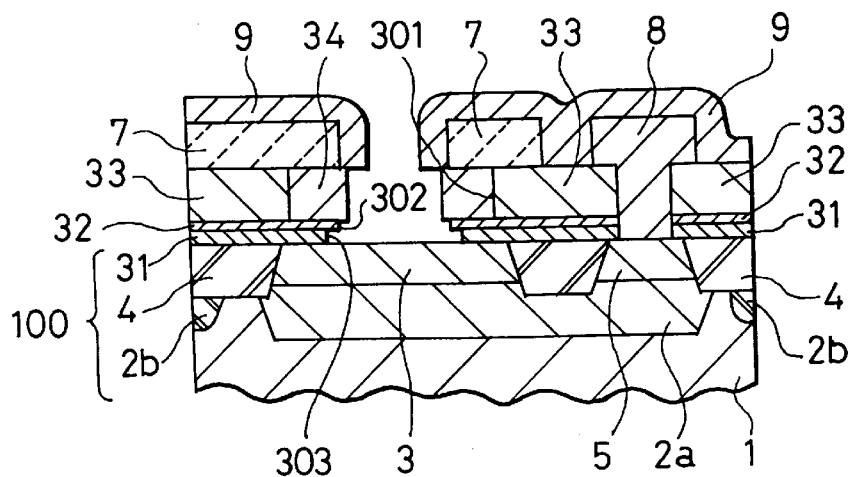

Subsequently, using an HF-containing etching solution, the SiO$_2$ layer 31 is selectively etched by a wet etching process through the windows 301 and 302, thereby forming the window 303 in the layer 31, as shown in FIG. 6H. The underlying collector region 3 is exposed through the window 303.

During this wet etching process, it is preferred that the removal area or amount of the SiO$_2$ layer 31 is set as few as possible. The reason is that the collector-base capacitance varies proportional to the etched area of the layer 31, resulting in a low capacitance value.

Figure 6I:
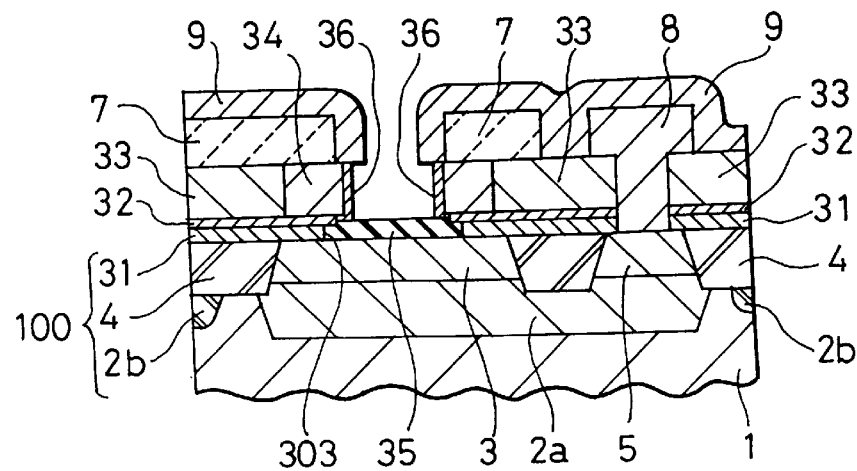

Next, the undoped single-crystal SiGe layer 35 is grown upward on the exposed collector region 3 within the windows 303 and 302 by a selective epitaxial growth process, as shown in FIG. 6I. The growth condition is, for example, that the growth temperature is 605° C., Si$_2$H$_6$ is supplied at a flow rate of 3 sccm as the source gas, GeH$_4$ is supplied at a flow rate of 2 sccm as the dopant gas in a UHV atmosphere, Here, the Ge concentration of the SiGe layer 35 is approximately 10%. The growth process is continued until the layer 35 is contacted with the Si$_3$N$_4$ layer 32. Even if some facets are generated during this process, problems are avoided because of the contact of the SiGe layer 35 with the Si$_3$N$_4$ layer 32.

It is preferred that the thickness of the SiGe layer 35 is approximately equal to the sum thickness of the SiO$_2$ layer 31 and Si$_3$N$_4$ layer 32. Here, the layer 35 has a thickness of approximately 25 nm.

It is needless to say that the thickness of the SiGe layer 35 can be increased while avoiding any crystal defects.

Simultaneous with the growth of the SiGe layer 35, the undoped polycrystalline SiGe layer 36 is laterally grown on the inner side face of the p$^+$-type polysilicon layer 34, as shown in FIG. 6I.

To diffuse the impurity (i.e., boron atoms) contained in the p-type polysilicon layer 34 into the undoped SiGe layer 36, a heat treatment process is then performed. As a result, the conductivity type of the undoped polycrystalline SiGe layer 36 is changed to p$^+$-type. The undoped single-crystal SiGe layer 35 is not doped with the boron atoms during this heat treatment process. The product at this stage is shown in FIG. 6I.

This heat treatment process is, for example, carried out at a temperature of 900° C. for 30 minutes.

Figure 7:
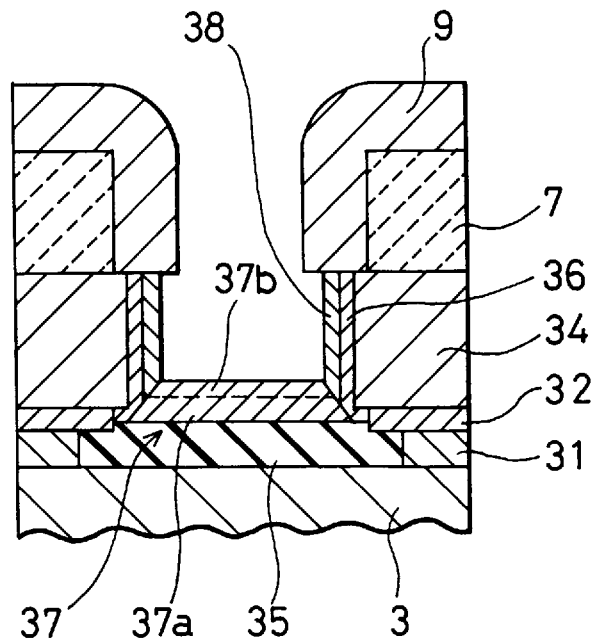
FIG. 7 is an enlarged cross-sectional view of the semiconductor device according to the second embodiment, which corresponds to the state of FIG. 6J.

Next, the intrinsic base region 37 is formed on the undoped single-crystal SiGe layer 35 within the winnows 301 and 302 by a selective epitaxial growth process. As shown in FIG. 7, the intrinsic base region 37 has a two-layer structure including bottom and top layers 37a and 37b. The bottom layer 37a is made of a p$^+$-type single-crystal SiGe, and the top layer 37b is made of a p-type single-crystal silicon (Si). The lower SiGe layer 37a has a graded impurity profile with respect to the thickness.

For example, the lower SiGe layer 37a has a thickness of 40 nm. The upper Si layer 37b has a thickness of 30 nm. The lower layer 37a has a doping concentration of Ge which linearly decreases from 10% at the bottom to 0% at the top as a function of the thickness level of the layer 37a. The two layers 37a and 37b have the same doping concentration of boron equal to 5×10$^{18}$ atoms/cm$^3$.

Figure 6J:
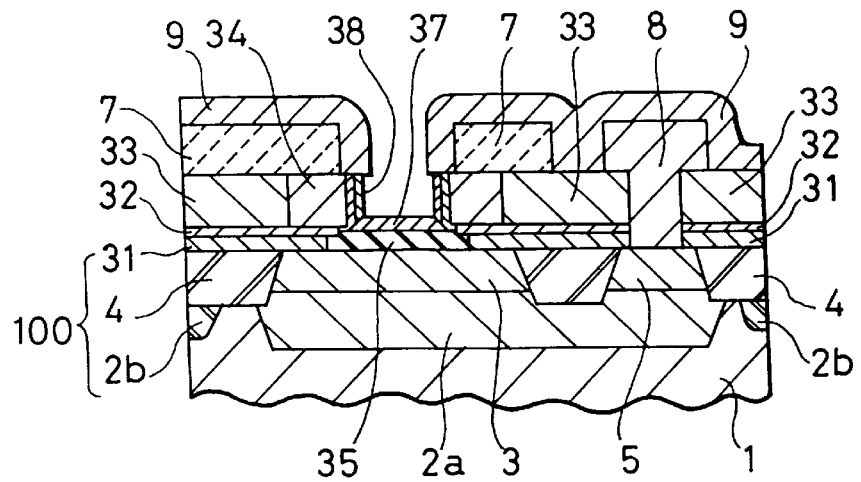

During the growth process of the intrinsic base region 37, as shown in FIGS. 6J and 7, the p-type polycrystalline SiGe layer 38 is laterally grown on the SiGe layer 36 within the window 301. The SiGe layer 38 contains germanium (Ge) and boron (B) as the dopant corresponding to the dopant for the intrinsic base region 37.

The growth condition for region 37 is, for example, that the growth temperature is 605° C., Si$_2$H$_6$ is supplied at a flow rate of 3 sccm as the source gas, GeH$_4$ and B$_2$H$_6$ are supplied at a flow rate of 2 sccm as the dopant gas in a UHV atmosphere.

Figure 6K:
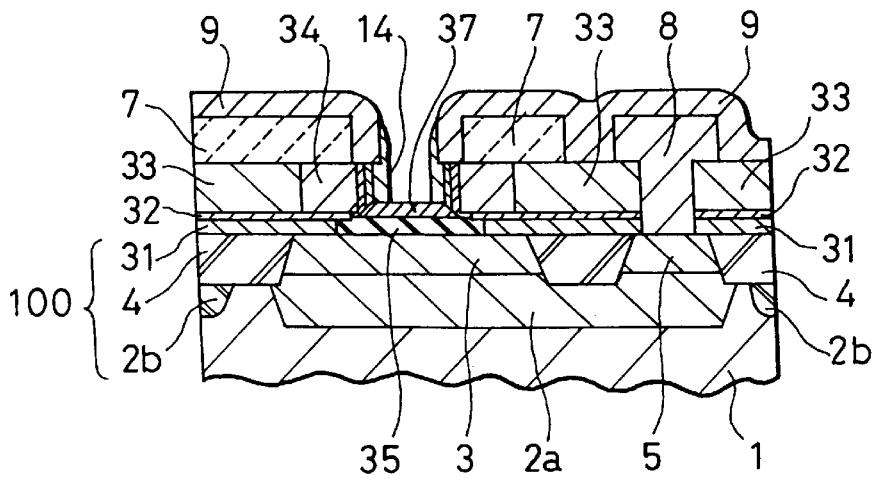
Figure 8:
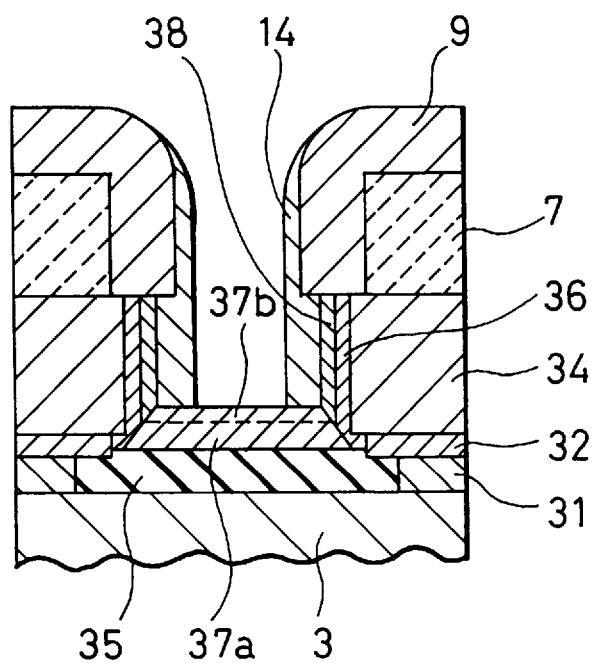
FIG. 8 is an enlarged cross-sectional view of the semiconductor device according to the second embodiment, which corresponds to the state of FIG. 6K.
Figure 9:
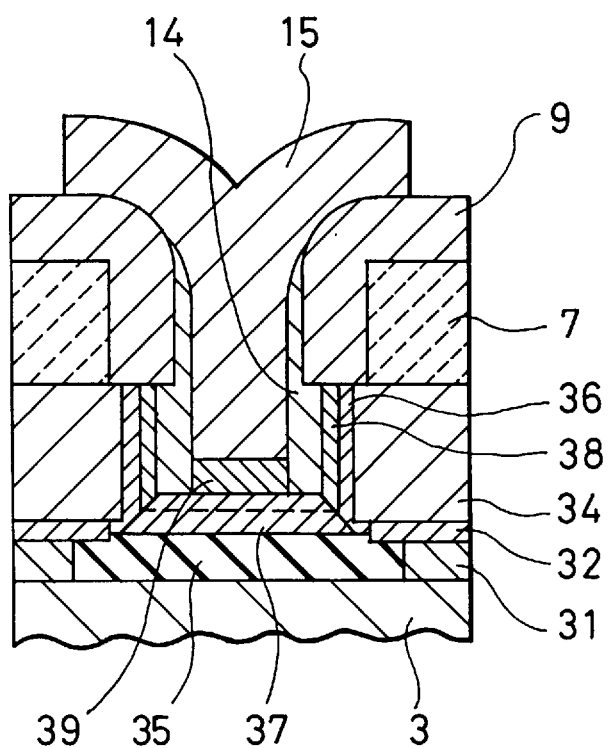
FIG. 9 is an enlarged cross-sectional view of the semiconductor device according to the second embodiment, which corresponds to the state of FIG. 6L.

Following this step the SiO$_2$ layer 14 is formed on the Si$_3$N$_4$ layer 9 by an LPCVD process and then, the layer 14 is selectively removed by an anisotropically etching process, thereby forming the SiO$_2$ sidewall 14, as shown in FIGS. 6K and 8. The bottom face of the sidewall 14 is contacted with the intrinsic base region 37. The outer side face of the sidewall 14 is contacted with the SiGe layer 38. The intrinsic base region 37 is exposed within the ring-shaped sidewall 14.

Further, the n-type single-crystal silicon emitter region 39 is grown on the exposed intrinsic base region 37 within the opening of the sidewall 14.

An undoped polysilicon layer is formed on the Si$_3$N$_4$ layer 9 to be contacted with the sidewall 14 by an LPCVD process. This polysilicon layer is contacted with the emitter region 39. The polysilicon layer is then doped with arsenic atoms by an ion-implantation process to reduce its resistivity. The ion implantation process is preferably performed with the acceleration energy of 70 keV at the dose of 1×10$^{16}$ atoms/cm$^2$.

The arsenic atoms may be doped into the undoped polysilicon layer simultaneously with its formation process.

Figure 6L:
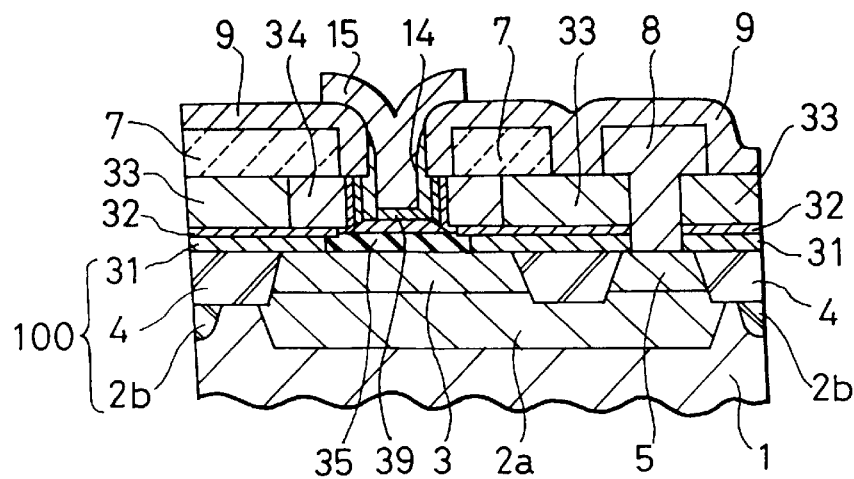

The arsenic-doped polysilicon layer is then patterned by photolithography and dry etching processes, thereby forming the emitter contact 15, as shown in FIG. 6L. The emitter contact 15 is electrically isolated from the SiGe layers 16 and 18 by the SiO₂ sidewall 14. The bottom of the contact 15 is contacted with the exposed intrinsic base region 37.

Further, in the same way as that of the first embodiment, the emitter, base, and collector electrodes 18a, 18b, and 18c are formed.

Through the above processes, the semiconductor device according to the second embodiment as shown in FIG. 5 is fabricated.

With the semiconductor device according to the second embodiment of FIG. 5, the p-type polycrystalline SiGe layer 38 and the SiGe layer 36 are located between the intrinsic base region 39 and the base contact region 7. In other words, the intrinsic base region 39 and the base contact region 7 are electrically connected with each other through the combination of the p-type polycrystalline SiGe layers 38 and 36.

The layers 38 and 36 are made of the p-type polycrystalline SiGe and the doping concentration of the boron atoms is determined so that the layers 38 and 36 are lower in electric resistance than the case where it is made of single-crystal silicon.

As a result, the same advantages or effects as those in the first embodiment can be obtained.

The semiconductor device according to the second embodiment has an additional advantage that the number of the necessary fabrication process steps is less than that of the first embodiment.

The semiconductor device according to the second embodiment has another advantage that the parasitic capacitance can be reduced compared with the first embodiment even if the thickness of the intrinsic base region is the same. The reason is that the distance between the polysilicon base contact and the intrinsic base region can be set longer than that of the first embodiment.

Third Embodiment

FIG. 10 shows a semiconductor device according to a third embodiment of the invention.

The third embodiment has the same structure and method as those of the second embodiment except for an emitter region 39A is formed by the diffusion of the dopant contained in the emitter contact 15 into the intrinsic base region 37. Therefore, no detailed description is provided here by adding the same reference numerals to the corresponding elements or the sake of simplification of description.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device comprising:

(a) providing a semiconductor base region having a first semiconductor active region of a first conductivity type in its inside;
said first active region being exposed from a main surface of said base region;

(b) forming a first insulating region on said main surface of said base region to cover said first active region;
said first insulating region having a first window which exposes said first active region;

(c) forming a semiconductor contact region of a second conductivity type opposite in polarity to said first conductivity type on said first insulating region;

said contact region having a second window whose size is smaller than that of said first window;
said contact region having an overhanging part which overhangs said first window;
said second window being defined by an inner end of said overhanging part which is entirely overlapped with said first window;
said contact region being made of a polycrystalline semiconductor;

(d) forming a second semiconductor active region of said second conductivity type on said first active region contacting therewith in said first window;

(e) forming a semiconductor connection region of said second conductivity type in said first window to surround said second active region; and
said connection region being contacted with said overhanging part of said contact region and said second active region, thereby electrically interconnecting said second active region with said contact region;
said connection region being made of a polycrystalline semiconductor.

2. A method as claimed in claim 1, wherein said semiconductor connection region includes first, second, third, and fourth polycrystalline semiconductor layers;
and wherein said step (e) comprises:
a step of selectively forming said first polycrystalline semiconductor layer contacting with said first active region and said fourth polycrystalline semiconductor layer contacting with said connection region; and
a step of selectively forming said second polycrystalline semiconductor layer contacting with said first polycrystalline semiconductor layer and said third polycrystalline semiconductor layer contacting with said fourth polycrystalline semiconductor layer.

3. A method as claimed in claim 2, wherein said first, second, third, and fourth polycrystalline semiconductor layers are formed in a direction perpendicular to said main surface of said base region.

4. A method as claimed in claim 3, wherein said first, second, third, and fourth polycrystalline semiconductor layers are made of polysilicon.

5. A method as claimed in claim 1, further comprising a step of forming a second insulating layer between said connection region and said first active region;
wherein said connection region is contacted with said second insulating layer and is not contacted with said first active region.

6. A method as claimed in claim 1, wherein said semiconductor connection region includes first, second, and third polycrystalline semiconductor layers;
and wherein said step (e) comprises:
a step of forming said first polycrystalline semiconductor layer in contact with said second active region;
a step of forming said third polycrystalline semiconductor layer in contact with said contact region; and
a step of forming said second polycrystalline semiconductor layer in contact with said first and second polycrystalline semiconductor layers.

7. A method as claimed in claim 6, wherein said first, second and third polycrystalline semiconductor layers are formed in a direction parallel to said main surface of said base region.

8. A method as claimed in claim 6, wherein said first and second polycrystalline semiconductor layers are made of SiGe, and said third polycrystalline semiconductor layer is made of polysilicon.

* * * * *